(12) United States Patent
Nagasaka et al.

(10) Patent No.: US 7,697,110 B2
(45) Date of Patent: Apr. 13, 2010

(54) EXPOSURE APPARATUS AND DEVICE MANUFACTURING METHOD

(75) Inventors: Hiroyuki Nagasaka, Kumagaya (JP); Taro Yamamoto, Koshi (JP); Osamu Hirakawa, Koshi (JP)

(73) Assignees: Nikon Corporation, Tokyo (JP); Tokyo Electron Limited, Tokyo (JP)

( * ) Notice: Subject to any disclaimer, the term of this patent is extended or adjusted under 35 U.S.C. 154(b) by 852 days.

(21) Appl. No.: 10/585,873

(22) PCT Filed: Jan. 14, 2005

(86) PCT No.: PCT/JP2005/000350

§ 371 (c)(1),
(2), (4) Date: Jul. 11, 2006

(87) PCT Pub. No.: WO2005/071717

PCT Pub. Date: Aug. 4, 2005

(65) Prior Publication Data

US 2007/0242241 A1    Oct. 18, 2007

(30) Foreign Application Priority Data

Jan. 26, 2004    (JP)    ............... 2004-017161

(51) Int. Cl.
 G03B 27/52    (2006.01)
 G03B 27/42    (2006.01)
(52) U.S. Cl. .......................... 355/30; 355/53
(58) Field of Classification Search ............ 355/30, 355/53, 72
See application file for complete search history.

(56) References Cited

U.S. PATENT DOCUMENTS

| 4,346,164 | A | 8/1982 | Tabarelli et al. |
| 4,480,910 | A | 11/1984 | Takanashi et al. |
| 5,528,118 | A | 6/1996 | Lee |
| 5,610,683 | A | 3/1997 | Takahashi |
| 5,623,853 | A | 4/1997 | Novak et al. |
| 5,715,039 | A | 2/1998 | Fukuda et al. |
| 5,825,043 | A | 10/1998 | Suwa |
| 5,874,820 | A | 2/1999 | Lee |
| 5,969,441 | A | 10/1999 | Loopstra et al. |

(Continued)

FOREIGN PATENT DOCUMENTS

DE    221 563    4/1985

(Continued)

*Primary Examiner*—Peter B Kim
(74) *Attorney, Agent, or Firm*—Oliff & Berridge, PLC

(57) ABSTRACT

An exposure apparatus for emitting exposure light onto a substrate via a projection optical system and a liquid to expose the substrate includes a supply pipe which supplies the liquid; a recovery pipe which recovers the liquid; a connection pipe which connects the supply pipe and the recovery pipe; and a switching device which switches a flow path of the liquid so that when liquid supply is stopped, the liquid that has flowed into the supply pipe flows to the recovery pipe via the connection pipe. The apparatus may further include a temperature regulation apparatus connected to the supply pipe, which performs temperature regulation of the liquid supplied to the supply pipe, and has a rough temperature regulator which roughly regulates the temperature of the liquid, and a fine temperature regulator which is arranged between the rough temperature regulator and the supply pipe and performs fine regulation of this temperature.

9 Claims, 8 Drawing Sheets

U.S. PATENT DOCUMENTS

| | | |
|---|---|---|
| 6,208,407 B1 | 3/2001 | Loopstra |
| 6,341,007 B1 | 1/2002 | Nishi et al. |
| 6,400,441 B1 | 6/2002 | Nishi et al. |
| 6,549,269 B1 | 4/2003 | Nishi et al. |
| 6,590,634 B1 | 7/2003 | Nishi et al. |
| 2004/0165159 A1 | 8/2004 | Lof et al. |
| 2005/0024609 A1 | 2/2005 | De Smit et al. |
| 2005/0048220 A1 | 3/2005 | Mertens et al. |
| 2005/0074704 A1 | 4/2005 | Endo et al. |
| 2005/0078286 A1 | 4/2005 | Dierichs et al. |
| 2005/0106512 A1 | 5/2005 | Endo et al. |
| 2005/0134817 A1 | 6/2005 | Nakamura |

FOREIGN PATENT DOCUMENTS

| | | |
|---|---|---|
| DE | 224 448 | 7/1985 |
| JP | A 58-202448 | 11/1983 |
| JP | A 59-19912 | 2/1984 |
| JP | A 59-019912 | 2/1984 |
| JP | A 62-65326 | 3/1987 |
| JP | A 62-065326 | 3/1987 |
| JP | A 63-157419 | 6/1988 |
| JP | A 4-305915 | 10/1992 |
| JP | A 4-305917 | 10/1992 |
| JP | A 4-330961 | 11/1992 |
| JP | A 5-062877 | 3/1993 |
| JP | A 6-53120 | 2/1994 |
| JP | A 6-124873 | 5/1994 |
| JP | A 6-168866 | 6/1994 |
| JP | A 6-188169 | 7/1994 |
| JP | A 7-220990 | 8/1995 |
| JP | A 8-166475 | 6/1996 |
| JP | A 8-316125 | 11/1996 |
| JP | A 8-330224 | 12/1996 |
| JP | A 10-163099 | 6/1998 |
| JP | A 10-214783 | 8/1998 |
| JP | A 10-303114 | 11/1998 |
| JP | A 10-340846 | 12/1998 |
| JP | A 11-135400 | 5/1999 |
| JP | A 11-176727 | 7/1999 |
| JP | A 2000-058436 | 2/2000 |
| JP | A 2000-505958 | 5/2000 |
| JP | A 2004-282023 | 10/2004 |
| JP | A 2004-301825 | 10/2004 |
| WO | WO 98/28665 | 7/1998 |
| WO | WO 99/49504 | 9/1999 |
| WO | WO 2004/019128 A2 | 3/2004 |
| WO | WO 2004/090634 A2 | 10/2004 |
| WO | WO 2004/092833 A2 | 10/2004 |
| WO | WO 2005/062351 A1 | 7/2005 |

EXPOSURE APPARATUS AND DEVICE MANUFACTURING METHOD

TECHNICAL FIELD

The present invention relates to an exposure apparatus that emits exposure light to a substrate via a projection optical system and a liquid to perform exposure, and also relates to a device manufacturing method.

BACKGROUND ART

Semiconductor devices and liquid crystal display devices are manufactured by a so-called photolithography technique for transferring a pattern formed on a mask onto a photosensitive substrate. The exposure apparatus used in this photolithography process has a mask stage that supports a mask and a substrate stage that supports a substrate, and it transfers the pattern of the mask to the substrate via a projection optical system while sequentially moving the mask stage and the substrate stage. In recent years, higher resolutions for projection optical systems have been in demand to handle the even higher integration of device patterns. The resolution of the projection optical system is higher the shorter the exposure wavelength used and the larger the numerical aperture of the projection optical system. For this reason, the exposure wavelength used in exposure apparatuses has become shorter year by year, and the numerical aperture of the projection optical system is also increasing. In addition, the mainstream exposure wavelength at present is 248 nm of a KrF excimer laser, but a shorter wavelength, 193 nm of an ArF excimer laser, is also coming into practical application. In addition, when exposure is performed, the depth of focus (DOF) is also important similar to the resolution. The resolution R and the depth of focus $\delta$ are expressed by the respective equations below.

$$R = k_1 \cdot \lambda / NA \quad (1)$$

$$\delta = \pm k_2 \cdot \lambda / NA^2 \quad (2)$$

Here, $\lambda$ is the exposure wavelength, NA is the numerical aperture of the projection optical system, and $k_1$ and $k_2$ are process coefficients. Based on Equation (1) and Equation (2), it is apparent that when the exposure wavelength $\lambda$ is made shorter to increase the numerical aperture NA in order to increase the resolution R, the depth of focus $\delta$ becomes smaller.

When the depth of focus $\delta$ is too small, it is difficult to match the substrate surface to the image plane of the projection optical system, and there is concern that the focus margin during the exposure operation will be insufficient. Therefore, the liquid immersion method disclosed in Patent Document 1 noted below, for example, has been proposed as a method of essentially shortening the exposure wavelength and increasing the depth of focus. In this liquid immersion method, the space between the lower surface of the projection optical system and the substrate surface is filled with a liquid such as water or an organic solvent to form a liquid immersion region, and the fact that the wavelength of the exposure light in liquid becomes 1/n in air (n is a refractive index of the liquid, which is normally approximately 1.2 to 1.6) is used to increase the resolution while expanding the depth of focus to approximately n times.

Patent Document 1: the booklet of PCT International Publication No. WO99/49504

In any case, when performing exposure based on the liquid immersion method, it is important to supply liquid in a desired status to prevent deterioration of the pattern image formed on the substrate and maintain exposure accuracy.

When the temperature of the liquid of the liquid immersion region fluctuates, the refractive index of the liquid, for example, fluctuates, and the pattern image formed on the substrate deteriorates, so it is particularly important to supply the liquid onto the substrate at the desired temperature. In addition, for example, in the case of a configuration in which the detected light of the focus detection system that detects the surface position information of the substrate surface and the detected light of the alignment system for aligning the substrate pass through the liquid of the liquid immersion region, when the temperature of the liquid of the liquid immersion region fluctuates, the optical path of the detected light fluctuates, deterioration of detection accuracy is brought about, and consequently this leads to a decrease in exposure accuracy. In addition, when the temperature of the liquid of the liquid immersion region fluctuates, the substrate and/or the substrate stage thermally deform, and there is a possibility of this as well leading to decreases in exposure accuracy and alignment accuracy. In addition, the pattern image formed on the substrate will also deteriorate due to bubbles being present in the liquid of the liquid immersion region and bubbles adhering to the lower surface of the projection optical system and/or the substrate surface.

In addition, it is also important to recover the liquid in a desired status to maintain exposure accuracy. When the liquid cannot be recovered well, there is a possibility of the various measurement operations relating to exposure processing being affected and of causing exposure accuracy to decrease due to the liquid flowing out and causing rust to occur in the peripheral mechanical components, bringing about fluctuation in the environment (humidity, etc.) where the substrate is placed, and causing changes in the refractive index on the optical path of the measurement light of the optical interferometer, used in stage position measurement. In addition, for example, when vibration is produced in the liquid recovery mechanism, there is a possibility that the vibration will cause deterioration of the pattern image projected onto the substrate and will bring about measurement errors of the interferometer that monitors the position of the substrate stage that holds the substrate.

DISCLOSURE OF THE INVENTION

The present invention has been devised taking such circumstances into account, and its purpose is to provide an exposure apparatus that is able to maintain exposure accuracy when performing exposure by emitting exposure light onto a substrate via a projection optical system and a liquid, as well as a device manufacturing method.

In order to solve the aforementioned problems, the present invention employs the following configurations.

The exposure apparatus according to the present invention is an exposure apparatus that emits exposure light onto a substrate via a projection optical system and a liquid to expose the substrate, wherein it includes a supply pipe which supplies the liquid, a recovery pipe which recovers the liquid, a connection pipe that connects the supply pipe and the recovery pipe, and switching device that, when the supply of liquid from the supply pipe is stopped, switches the flow path so that the liquid that has flowed into the supply pipe flows to the recovery pipe via the connection pipe.

According to the present invention, in the case of a configuration in which a liquid whose temperature has been regulated by a temperature regulation apparatus, for example, is supplied onto a substrate via the supply pipe, when the supply of liquid is stopped, the switching device is used to cause the liquid that has flowed into the supply pipe to flow to the recovery pipe, so it is possible to prevent the occurrence of problems such as fluctuations in the temperature of the supplied liquid due to, for example, driving and stopping of driving of the temperature regulation apparatus. For example, when liquid immersion exposure is not performed and the flow of liquid into the supply pipe from the temperature regulation apparatus is stopped, inconvenience occurs at the time of the resumption of the liquid supply, such as the temperature of the liquid that flows out from the temperature regulation apparatus changing slightly and it being necessary to provide wait time for the liquid to reach the desired temperature. However, even in the case where the supply of liquid is resumed after the supply of liquid was stopped, by causing the liquid to flow into the supply pipe and maintaining the driving of the temperature regulation apparatus and the inflow of liquid to the supply pipe even when the supply of liquid is stopped, it is possible to supply liquid of the desired temperature with good efficiency without providing wait time (without reducing throughput). Also, by causing the liquid to flow into the recovery pipe using the switching device when the supply of liquid is stopped, it is possible to prevent liquid from flowing out, and it is possible to prevent the occurrence of rust in the peripheral mechanical components due to the outflow of the liquid as well as the occurrence of the inconvenience of fluctuation of the environment (humidity, etc.) where the substrate is placed.

Note that the supply pipe is not only able to supply the liquid onto the substrate that is the subject of the exposure processing but is also able to supply the liquid onto various optical sensors such as the illuminance sensor provided on the substrate stage. Therefore, the optical sensors are able to execute the respective measurement processes with high accuracy via the liquid supplied in the desired status.

The exposure apparatus according to the present invention is an exposure apparatus that emits exposure light onto a substrate via a projection optical system and a liquid to expose the substrate, wherein it includes a supply pipe which supplies the liquid, a temperature regulation apparatus which is connected to the supply pipe and has a rough temperature regulator, which roughly regulates the temperature of the liquid, and a fine temperature regulator, which is arranged between the rough temperature regulator and the supply pipe and performs fine regulation of the temperature of the liquid, so as to perform temperature regulation of the liquid supplied to the supply pipe, and a degassing apparatus that is arranged between the rough temperature regulator and the fine temperature regulator and that reduces the gas dissolution concentration in the liquid.

According to the present invention, it is possible to regulate the temperature of the liquid with high accuracy using the temperature regulation apparatus that has the rough temperature regulator and the fine temperature regulator and to supply it, and it is possible to maintain high exposure accuracy. In addition, the degassing apparatus which reduces the gas dissolution concentration in the liquid is provided in the temperature regulation apparatus, so it is possible to supply the liquid after adequately suppressing the occurrence of bubbles in this liquid, and it is possible to prevent the occurrence of bubbles from the liquid of the liquid immersion region. In addition, even assuming that bubbles were to occur in the flow path through which the liquid flows, such as the lower surface of the projection optical system and/or the surface of the substrate, it would be possible for the liquid to absorb and remove the bubbles that have occurred in this flow path by causing the liquid in which the occurrence of bubbles has been adequately suppressed to flow through the flow path. In this way, since it is possible to prevent bubbles from being in the liquid of the liquid immersion region, it is possible to prevent deterioration of the pattern image due to bubbles and to maintain high exposure accuracy. In addition, by arranging the degassing apparatus between the rough temperature regulator and the fine temperature regulator, the degassing apparatus can perform degassing well, since it performs degassing processing of liquid that has been temperature-regulated by the rough temperature regulator. Then, after the liquid that has been degassed by the degassing apparatus has been temperature-regulated with high accuracy by the fine temperature regulator, it is possible to supply it via the supply pipe, and it is possible to perform exposure processing via the liquid that has been regulated to the desired temperature.

The exposure apparatus according to the present invention is an exposure apparatus that emits exposure light onto a substrate via a projection optical system and a liquid to expose the substrate, wherein it comprises a supply pipe which supplies the liquid, a chamber, which accommodates projection optical system and the supply pipe and whose interior is air-conditioned, a temperature measuring apparatus that measures the temperature within the chamber, and a temperature regulation apparatus that is connected to the supply pipe and performs temperature regulation of the liquid supplied to the supply pipe, and temperature regulation of the liquid is controlled by the temperature regulation apparatus based on a measurement result of the temperature measuring apparatus.

According to the present invention, since temperature regulation of the liquid by the temperature regulation apparatus is controlled based on the measurement result of the temperature measuring apparatus that measures the temperature within the air-conditioned chamber, it is possible to supply liquid whose temperature has been regulated with high accuracy while taking into account the temperature environment within the air-conditioned chamber. Therefore, it is possible to perform exposure processing with good accuracy via the liquid that has been regulated to the desired temperature.

The exposure apparatus according to the present invention is an exposure apparatus that emits exposure light onto a substrate via a projection optical system and a liquid to expose the substrate, wherein it comprises a liquid supply mechanism which supplies the liquid, a liquid recovery mechanism which recovers the liquid and is provided separately from the liquid supply mechanism, and a support member that supports the liquid recovery mechanism and is vibrationally separated with respect to the projection optical system.

According to the present invention, the liquid recovery mechanism is vibrationally separated with respect to the projection optical system and the liquid supply mechanism, so even if vibration were to occur in the liquid recovery mechanism, that vibration would not be transmitted to the projection optical system. Therefore, it is possible to prevent the occurrence of the inconvenience such that the pattern image to be formed on the substrate deteriorates due to the vibration of the projection optical system, and it is possible to perform exposure processing with good accuracy.

The device manufacturing method according to the present invention is characterized by using an exposure apparatus described above. According to the present invention, it is possible to perform exposure processing for a substrate and various measurement processes via a liquid that has been regulated to the desired state and it is possible to provide a device that is able to exhibit the desired performance.

According to the present invention, it is possible to form a pattern image on a substrate, with high accuracy, via a liquid that has been regulated to the desired status and to perform measurement processing with high accuracy using various sensors, and it is possible to perform exposure processing with good accuracy.

BEST MODE FOR CARRYING OUT THE INVENTION

Figure 1:
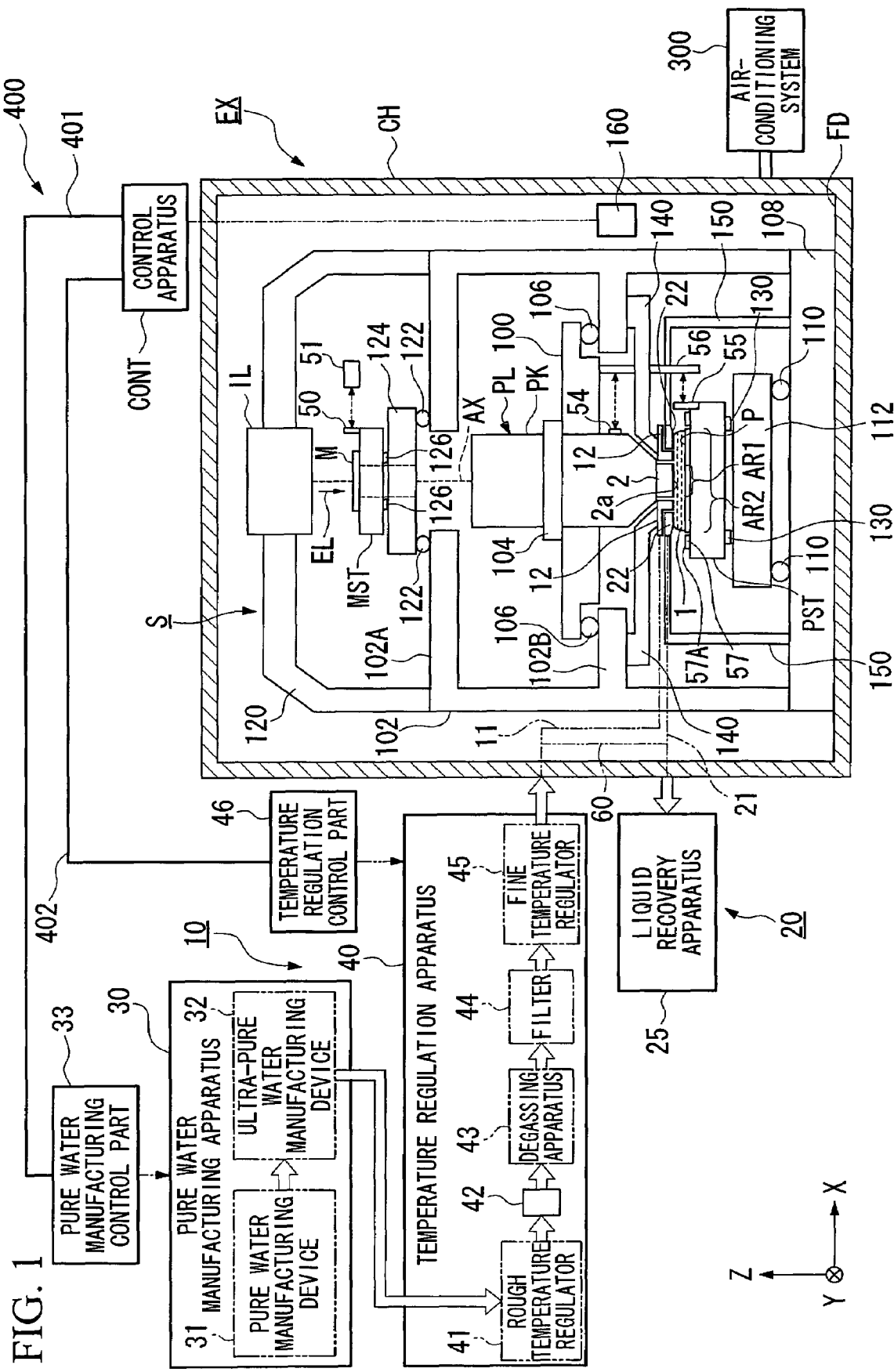
FIG. 1 is a schematic diagram that shows the structure of an embodiment of the exposure apparatus of the present invention.

The exposure apparatus of the present invention will be explained below while referring to drawings. FIG. 1 is a schematic block diagram that shows an embodiment of the exposure apparatus of the present invention.

In FIG. 1, an exposure apparatus EX has a mask stage MST that supports a mask M, a substrate stage PST that supports a substrate P, an illumination optical system IL that illuminates a mask M supported on the mask stage MST using exposure light EL, and a projection optical system PL that projects the pattern image of the mask M illuminated by the exposure light EL onto a substrate P supported on the substrate stage PST so as to expose the substrate P. An exposure apparatus main body S that includes the illumination optical system IL, the mask stage MST, the projection optical system PL, and the substrate stage PST is accommodated in the interior of a chamber apparatus CH, and the operation of the exposure apparatus main body S is controlled by a control apparatus CONT. The interior of the chamber apparatus CH is air-conditioned by an air-conditioning system 300. The air-conditioning system 300 regulates the environment of the interior of the chamber apparatus CH, specifically, the degree of cleanliness, the temperature, the humidity, the pressure, etc.

The exposure apparatus EX of this embodiment is a liquid immersion exposure apparatus that applies the liquid immersion method to effectively shorten the exposure wavelength to improve resolution and to effectively increase the depth of focus, and it has a liquid supply mechanism 10 that supplies a liquid 1 onto a substrate P and a liquid recovery mechanism 20 that collects the liquid 1 on the substrate P. The exposure apparatus EX forms a liquid immersion region AR2 (locally) on a portion on the substrate P that includes the projection region AR1 of the projection optical system PL, by means of liquid 1 supplied from the liquid supply mechanism 10 at least while the pattern image of the mask M is being transferred onto the substrate P. Specifically, the exposure apparatus EX employs a local liquid immersion system that fills a space between an optical element 2 at the end part of the image plane side of the projection optical system PL and the surface of the substrate P arranged on that image plane side with the liquid 1, and the pattern of the mask M is projected onto the substrate P by emitting exposure light EL, which has passed through the mask M via the projection optical system PL and the liquid 1 between this projection optical system PL and the substrate P, to the substrate P, thereby exposing the substrate P.

Here, in this embodiment, an explanation will be given which uses as an example the case in which a scanning exposure apparatus (a so-called scanning stepper) that synchronously moves the mask M and the substrate P in mutually different directions (opposite directions) in the scanning direction while exposing substrate P with the pattern formed on the mask M is used as the exposure apparatus EX. In the following explanation, the direction that matches the optical axis AX of the projection optical system PL is the Z axis direction, the synchronous movement direction (scan direction) of the mask M and the substrate P within a plane perpendicular to the Z axis direction is the X axis direction, and the direction perpendicular to the Z axis direction and the X axis direction (non-scan direction) is the Y axis direction. In addition, the directions of rotation (inclination) about the X axis, the Y axis and the Z axis are considered to be $\theta X$, $\theta Y$ and $\theta Z$ respectively. Note that the "substrate" discussed here includes a semiconductor wafer coated with a photoresist which is a photosensitive material, and the "mask" includes a reticle on which a device pattern that is reduction-projected onto a substrate is formed.

The illumination optical system IL illuminates a mask M supported on a mask stage MST using exposure light EL and has an exposure light source, an optical integrator that makes the illumination intensity of the light beam emitted from the exposure light source uniform, a condenser lens that focuses the exposure light EL from the optical integrator, a relay lens system, and a variable field stop that sets the illumination region on the mask M resulting from the exposure light EL to a slit shape. The prescribed illumination region on the mask M is illuminated by exposure light EL with a uniform illuminance distribution by means of the illumination optical system IL. For the exposure light EL emitted from the illumination optical system IL, for example, deep ultraviolet light (DUV light) such as bright lines (g-rays, h-rays, i-rays) that emerge from a mercury lamp and KrF excimer laser light (wavelength of 248 nm) or vacuum ultraviolet light (VUV light) such as ArF excimer laser light (wavelength of 193 nm) and $F_2$ laser light (wavelength of 157 nm) are used. In this embodiment, ArF excimer laser light is used.

The mask stage MST supports the mask M, and it is capable of two-dimensional movement within a plane perpendicular to the optical axis AX of the projection optical system PL, that is, within the XY plane, and it is capable of slight rotation in the $\theta Z$ direction. The mask stage MST is driven by a mask stage drive apparatus such as a linear motor controlled by a control apparatus CONT. A movable mirror 50 is provided on the mask stage MST. In addition, a laser interferometer 51 is provided at a position that opposes the movable mirror 50. The position in the two-dimensional direction and the angle of rotation of the mask M on the mask stage MST are measured in real time by the laser interferometer 51, and the measurement results are output to the control apparatus CONT. The control apparatus CONT performs positioning of the mask M supported on the mask stage MST by driving the mask stage drive apparatus based on the measurement results of the laser interferometer 51.

The projection optical system PL exposes the substrate P by projecting the pattern of the mask M onto the substrate P at the prescribed magnification β, and it is configured by a plurality of optical elements that include the optical element (lens) 2 provided on the end part on the substrate P side (i.e., the image plane side of the projection optical system PL), and these optical elements are supported by a lens barrel PK. In this embodiment, the projection optical system PL is a reduction system in which the projection magnification β is ¼ or ⅕, for example. Note that the projection optical system PL may be either an equal magnification system or an enlargement system. In addition, the projection optical system PL may be any of a reflecting system that does not include a diffracting element, a diffracting system that does not include a reflecting element, or a catadioptric system that includes both a diffracting element and a reflecting element. In addition, the optical element (lens) 2 of the front end part of the projection optical system PL of this embodiment is removably (replacably) provided to the lens barrel PK, and the liquid 1 of the liquid immersion region AR2 comes into contact with the optical element 2.

In this embodiment, pure water is used for the liquid 1. Pure water is able to transmit not only ArF excimer laser light but deep ultraviolet light (DUV light) such as bright lines (g-rays, h-rays, i-rays) emerging from a mercury lamp and KrF excimer laser light (wavelength of 248 nm). Note that, in this embodiment, the numerical aperture of the projection optical system for which pure water is used for liquid immersion exposure is set to one or more (approximately 1.0 to 1.2).

The optical element 2 is formed of calcium fluorite. surfaces of calcium fluorite or surfaces coated with $MgF_2$, $Al_2O_3$, $SiO_2$, etc. have high affinity with pure water, so it is possible to make the liquid 1 adhere to nearly the entire surface of the liquid contact surface 2a of the optical element 2. Specifically, in this embodiment, a liquid (water) 1 that has high affinity with the liquid contact surface 2a of the optical element 2 is supplied, so the adhesion between the liquid 1 and the liquid contact surface 2a of the optical element 2 is very tight, and the optical path between the optical element 2 and the substrate P can be reliably filled with the liquid 1. Note that the optical element 2 may be silica glass that has high affinity with water. In addition, hydrophilic (lyophilic) treatment may be performed on the liquid contact surface 2a of the optical element 2 to further increase affinity with the liquid 1.

The substrate stage PST supports (holds) the substrate P via a substrate holder, and two-dimensional movement is possible within the XY plane and fine rotation is possible in the θZ direction. Furthermore, the substrate stage PST is also able to move in the Z axis direction, the θX direction and the θY direction. The substrate stage PST is driven by a substrate stage drive apparatus such as a linear motor controlled by a control apparatus CONT. The substrate stage PST controls the Z position (focus position) and inclination of the substrate P to align the surface of the substrate P with the image plane of the projection optical system PL by means of an autofocus system and an auto leveling system while moving in the XY direction to perform positioning of the substrate P in the X axis direction and the Y axis direction.

A movable mirror 55 is provided on the substrate stage PST, and a reference mirror (fixed mirror) 54 is provided on the lens barrel PK. In addition, a laser interferometer 56 is provided at a position that opposes the movable mirror 55 and the reference mirror 54. The laser interferometer 56 emits a measurement beam (measurement light) to the movable mirror 55 as it emits a reference beam (reference light) to the reference mirror 54. The respective reflected light from the movable mirror 55 and the reference mirror 54 based on the emitted measurement beam and reference beam are received by the light receiving part of the laser interferometer 56, and the laser interferometer 56 makes these lights interfere with each other and measures the amount of change in the length of the optical path of the measurement beam based on the length of the optical path of the reference beam as a reference and, consequently the position information of the movable mirror 55 using the reference mirror 54 as a reference, that is, position information of the substrate stage PST. The position in the two-dimensional direction and the angle of rotation of the substrate P on the substrate stage PST are measured in real time by the laser interferometer 56, and the measurement results are output to the control apparatus CONT. The control apparatus CONT positions the substrate P supported on the substrate stage PST by driving the substrate stage drive apparatus based on the measurement results of the laser interferometer 56.

In addition, an annular plate part 57 is provided on the substrate stage PST so as to surround the substrate P. The plate part 57 has a flat surface 57A that is nearly the same height as the surface of the substrate P supported on the substrate stage PST. Here, there is a gap of approximately 0.1 to 1 mm between the edge of the substrate P and the plate part 57, but there is almost no flow of the liquid 1 into that gap due to the surface tension of the liquid 1, and even in the case where the vicinity of the periphery of the substrate P is exposed, it is possible to hold the liquid 1 below the projection optical system PL by means of the plate part 57.

The exposure apparatus EX (exposure apparatus main body S) has a lens barrel surface plate 100, which supports the projection optical system PL, and a main frame 102, which supports the lens barrel surface plate 100, the mask stage MST and the substrate stage PST. The main frame 102 is installed on a base 108 supported on the floor surface FD of the interior of the chamber apparatus CH. An upper side step part 102A and a lower side step part 102B that protrude inward are formed on the main frame 102.

The illumination optical system IL is supported by a support frame 120 secured to the upper part of the main frame 102. A mask base 124 is supported at the upper side step part 102A of the main frame 102 via a vibration isolating apparatus 122. An opening that allows the pattern image of the mask M to pass through is formed at the center part of mask stage MST and the mask base 124. A plurality of gas bearings (air bearings) 126, which are non-contact bearings, are provided at the lower surface of the mask stage MST. The mask stage MST is supported without contact with respect to the upper surface (guide plane) of the mask base 124 by means of the air bearings 126, and two-dimensional movement within the XY plane and fine rotation in the θZ axis direction are possible by means of the mask stage drive apparatus.

A flange 104 is provided at the outer circumference of the lens barrel PK that holds the projection optical system PL, and the projection optical system PL is supported by the lens barrel surface plate 100 via this flange 104. A vibration isolating apparatus 106 that includes air mounts, etc. is arranged between the lens barrel surface plate 100 and the lower side step part 102B of the main frame 102, and the lens barrel surface plate 100 that supports the projection optical system PL is supported at the lower side step part 102B of the main frame 102 via the vibration isolating apparatus 106. Through this vibration isolating apparatus 106, the lens barrel surface plate 100 and the main frame 102 are vibrationally separated so that vibration of the main frame 102 is not transmitted to the lens barrel surface plate 100 that supports the projection optical system PL.

A plurality of gas bearings (air bearings) 130, which are non-contact bearings, are provided on the lower surface of the substrate stage PST. In addition, a stage base 112 is supported on the base 108 via a vibration isolating apparatus 110 that includes air mounts, etc. The substrate stage PST is supported without contact with respect to the upper surface (guide surface) of the stage base 112 by means of air bearings 130, and two-dimensional movement within the XY plane and fine rotation in the θZ direction of the substrate stage PST are possible through a substrate stage drive apparatus. Through this vibration isolating apparatus 110, the stage base 112, the main frame 102 and the base 108 (floor surface FD) are vibrationally separated so that the vibration of the base 108 (floor surface FD) and the main frame 102 is not transmitted to the stage base 112 that supports the substrate stage PST without contact.

A liquid supply member 12 (to be discussed in detail below) that forms a portion of a liquid supply mechanism 10 is supported at the lower side step part 102B of the main frame 102 via a first support member 140. Note that, in FIG. 1, the drawing is such that only liquid supply member 12 is supported by the first support member 140, but the supply pipe 11 that connects with that liquid supply member 12 may also be supported by the first support member 140.

In addition, the liquid recovery member 22 (to be discussed in detail below) that forms a portion of the liquid recovery mechanism 20 is supported by the base 108 (or the floor surface FD) via a second support member 150. Note that, in FIG. 1, the drawing is such that only liquid recovery member 22 is supported by the second support member 150, but a recovery pipe 21 that connects with that liquid recovery member 22 may also be supported by the second support member 150.

Here, the liquid supply member 12 and the liquid recovery member 22 are separately provided. In addition, the main frame 102, which supports the liquid supply member 12 via the first support member 140, and the base 108 which supports the liquid recovery member 22 via the second support member 150, are respectively vibrationally separated from the lens barrel surface plate 100, which supports the lens barrel PK of the projection optical system PL via the flange 104, via the vibration isolating apparatus 106. For this reason, the liquid recovery member 22, which forms the liquid recovery mechanism 20, which is supported on the base 108 via the second support member 150, is vibrationally separated with respect to the projection optical system PL. In addition, since the main frame 102 and the base 108 are vibrationally separated from the stage base 112, the liquid supply member 12, which is supported by the main frame 102, and the liquid recovery member 22, which is supported by the base 108, are also vibrationally separated with respect to the substrate stage PST supported on the stage base 112.

Note that the liquid recovery member 22, which forms a portion of the liquid recovery mechanism 20, is vibrationally separated with respect to the projection optical system PL, but a vibration isolating apparatus may be arranged between the first support member 140, which supports the liquid supply member 12 of the liquid supply mechanism 10, and the second support member 150, which supports the liquid recovery member 22 of the liquid recovery mechanism 20, so that the liquid supply member 12 of the liquid supply mechanism 10 may be vibrationally separated with respect to both the projection optical system PL and the liquid supply member 12 of the liquid supply mechanism 10. For example, by providing the second support member 150 on the base 108 via a vibration isolating apparatus, it is possible to vibrationally separate the liquid supply member 12 of the liquid supply mechanism 10 and the liquid recovery member 22 of the liquid recovery mechanism 20 from each other. In addition, the liquid recovery mechanism 20 may be formed from a plurality of members, and all of these may be vibrationally separated from the projection optical system PL, and as described above, it is also possible to separate only a portion thereof. What is essential is that members in which large vibration is likely to occur be vibrationally separated at least with respect to the projection optical system PL.

In addition, the laser interferometer 56 is attached to the lens barrel surface plate 100. For this reason, in addition to the laser interferometer 56 attached to the lens barrel surface plate 100 and the liquid supply member 12 (liquid supply mechanism 10) supported on the main frame 102 via the first support member 140 being vibrationally separated from each other, the laser interferometer 56 is also vibrationally separated from the liquid recovery member 22 (liquid recovery mechanism 20) supported on the base 108 via the second support member 150. Also, measuring systems that are not shown in the drawing, such as a focus detection system for measuring the focus position (Z position) and inclination of the substrate P and an alignment system that detects alignment marks on the substrate P are also supported on the lens barrel surface plate 100, and these measuring systems are also vibrationally separated from the main frame 102, the liquid supply member 12 and the liquid recovery member 22.

Figure 2:
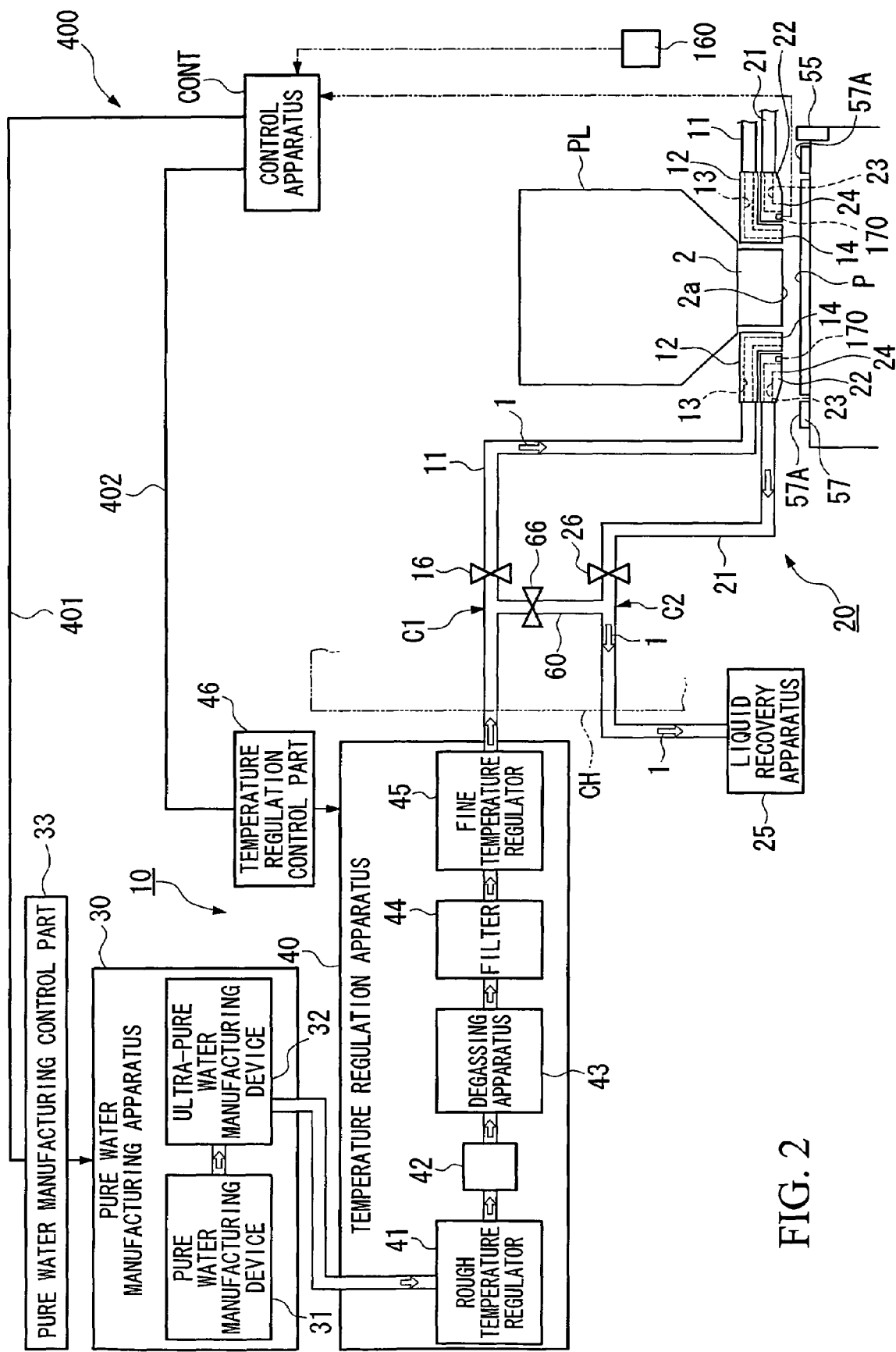
FIG. 2 is a schematic diagram that shows the structure of the liquid supply mechanism and the liquid recovery mechanism.

FIG. 2 is a schematic block diagram that shows the liquid supply mechanism 10, which supplies the liquid 1, and the liquid recovery mechanism 20, which collects the liquid 1. In the aforementioned way, the liquid 1 in this embodiment is pure water, and the liquid supply mechanism 10 has a pure water manufacturing apparatus 30, a temperature regulation apparatus 40, which performs temperature regulation of the liquid (pure water) 1 manufactured by the pure water manufacturing apparatus 30, and the liquid supply member 12 connected to the temperature regulation apparatus 40 via a supply pipe 11. The liquid supply member 12 is provided at a position near the substrate P so as to surround the optical element 2 at the front end part of the projection optical system PL, and it has supply ports 14 that oppose the substrate P. The supply pipe 11 and the supply ports 14 are connected via a supply flow path 13 that is formed at the interior of the liquid supply member 12. The liquid supply mechanism 10 supplies a liquid 1 onto the substrate P, and the liquid 1 that has been manufactured by the pure water manufacturing apparatus 30 and had its temperature regulated by the temperature regulation apparatus 40 is supplied onto the substrate P from the supply ports 14 via the supply pipe 11 and the supply flow path 13 of the liquid supply member 12.

In addition, the liquid recovery mechanism 20 has a liquid recovery member 22, which is provided at a position near the substrate P so as to surround the optical element 2 at the front end part of the projection optical system PL, and a liquid recovery apparatus 25 that is connected to the liquid recovery member 22 via a recovery pipe 21. The liquid recovery member 22 has recovery ports 24 that oppose the substrate P. The recovery pipe 21 and the recovery ports 24 are connected via a recovery flow path 23 formed at the interior of the liquid recovery member 22. The liquid recovery mechanism 20 collects the liquid 1 on the substrate P, and the liquid 1 on the substrate P is collected by the liquid recovery apparatus 25 via the recovery ports 24 and the recovery flow path 23 of the liquid recovery member 22, and the recovery pipe 21. The liquid recovery apparatus 25 has, for example, a vacuum system (suction apparatus) such as a vacuum pump, a gas-liquid separator, which separates the liquid 1 collected from the recovery ports 24 from the gas that was collected together with that liquid 1, and a tank, which contains the collected liquid 1. The operation of the liquid recovery apparatus 25 is controlled by the control apparatus CONT.

The pure water manufacturing apparatus 30 and the temperature regulation apparatus 40 are arranged outside the chamber apparatus CH (see FIG. 1). Through this, it is possible to reduce the effects that the heat generated from the pure water manufacturing apparatus 30 and/or the temperature regulation apparatus 40 has on the exposure apparatus main body S. On the other hand, the supply pipe 11 and the recovery pipe 21 are arranged at the interior of the air-conditioned chamber apparatus CH. Temperature fluctuation of the supply pipe 11 is reduced by arranging the supply pipe 11 at the interior of the air-conditioned (temperature-regulated) chamber apparatus CH.

The pure water manufacturing apparatus 30 has a pure water manufacturing device 31, which purifies, for example, water that contains suspended matter or impurities to manufacture pure water with the prescribed purity, and an ultra-pure water manufacturing device 32, which further removes impurities from the pure water manufactured by the pure water manufacturing device 31 to manufacture pure water with high purity (ultra-pure water). For example, tap water or water that has been collected by the liquid recovery mechanism 20 is supplied to the pure water manufacturing device 31 of the pure water manufacturing apparatus 30, and the pure water manufacturing device 31 purifies that supplied water to manufacture pure water of the prescribed purity.

The temperature regulation apparatus 40 is such that it performs temperature regulation of the liquid (pure water) 1 manufactured by the pure water manufacturing apparatus 30 and supplied by the supply pipe 11, and one end part thereof is connected to the pure water manufacturing apparatus 30 (ultra-pure water manufacturing device 32), and the other end part is connected to the supply pipe 11, and after temperature regulation of the liquid 1 manufactured by the pure water manufacturing apparatus 30 has been performed, that temperature regulated liquid 1 is sent to the supply pipe 11. The temperature regulation apparatus 40 has a rough temperature regulator 41, which roughly regulates the temperature of the liquid 1 supplied from the ultra-pure water manufacturing device 32 of the pure water manufacturing apparatus 30, a flow controller 42 called a mass flow controller, which is provided on the downstream side (supply pipe 11 side) of the flow path of the rough temperature regulator 41 and controls the amount per unit time of the liquid 1 provided to the supply pipe 11 side, a degassing apparatus 43 for reducing the gas dissolution concentration in the liquid 1 that has passed through the flow controller 42, a filter 44 that removes foreign matter in the liquid 1 that has been degassed by the degassing apparatus 43, and a fine temperature regulator 45, which performs fine regulation of the temperature of the liquid 1 that has passed through the filter 44.

The rough temperature regulator 41 performs temperature regulation of the temperature of the liquid 1 sent from the ultra-pure water manufacturing device 32 at a rough accuracy of, for example, approximately ±0.1° C. with respect to a target temperature (for example, 23° C.). The flow controller 42 is arranged between the rough temperature regulator 41 and the degassing apparatus 43, and it controls the flow per unit time of the liquid 1, that has been temperature-regulated by the rough temperature regulator 41, with respect to the degassing apparatus 43 side. Here, the flow controller 42 is of a configuration that performs flow control of the liquid 1 that has been temperature-regulated by the rough temperature regulator 41, so flow control can be performed with high accuracy. Specifically, when an attempt is made to perform flow control of a liquid 1 for which temperature regulation has not been performed, for example, in the case where temperature fluctuation of the liquid 1 is large, there is a possibility that the flow of the liquid 1 supplied to the degassing apparatus 43 side will also fluctuate due to that temperature fluctuation, but by performing flow control on the liquid 1 that has been temperature-regulated by the rough temperature regulator 41, the flow controller 42 is able to perform flow control with high accuracy.

The degassing apparatus 43 is arranged between the rough temperature regulator 41 and the fine temperature regulator 45 and specifically between the flow controller 42 and the filter 44, and it degasses the liquid 1 sent from the flow controller 42 to reduce the gas dissolution concentration in the liquid 1. It is possible to use a well-known degassing apparatus such as a pressure reduction apparatus that degasses the supplied liquid 1 by reducing the pressure of the liquid 1 as the degassing apparatus 43.

In addition, it is also possible to use an apparatus that uses a filtration filter such as a hollow fiber membrane filter to perform gas-liquid separation of the liquid 1 and that includes a filter that removes the separated gas components using a vacuum system, or an apparatus that uses centrifugal force to perform gas-liquid separation of the liquid 1 and that includes a degassing pump that removes the separated gas components using a vacuum system.

The degassing apparatus 43 is of a configuration that performs the degassing of the liquid 1 that has been temperature-regulated by the rough temperature regulator 41, so it is able to perform degassing well. Specifically, when an attempt is made to perform degassing with respect to a liquid 1 on which temperature regulation has not been performed, for example, in the case where temperature fluctuation of the liquid 1 is large, there is a possibility that the degassing level (gas dissolution concentration) will fluctuate due to that temperature fluctuation, but by degassing the liquid 1 that has been temperature-regulated by the rough temperature regulator 41, the degassing apparatus 43 is able to sufficiently stably reduce the gas dissolution concentration in the liquid 1.

The filter 44 is arranged between the rough temperature regulator 41 and the fine temperature regulator 45 and specifically between the degassing apparatus 43 and the fine temperature regulator 45, and it removes the foreign matter in the liquid 1 that has drawn from the degassing apparatus 43. It is conceivable that there is a possibility of a slight amount of foreign matter (particles) mixing into the liquid 1 when it passes through the flow controller 42 and the degassing apparatus 43, but by providing the filter 44 at the downstream side (supply pipe 11 side) of the flow controller 42 and the degassing apparatus 43, it is possible to remove foreign matter by means of that filter 44. It is possible to use a well-known filter such as a hollow fiber membrane filter for the filter 44; for example, it is preferable to use one that has performance such that the number of bubbles and particles larger than 0.1 μm included in the liquid that has passed through the filter 44 becomes less than $0.3/cm^3$. Note that, ultimately, it is preferable to keep the number of bubbles and particles larger than 0.1 μm included in the liquid between the optical element 2 of the projection optical system PL and the substrate P to less than one.

The fine temperature regulator 45 is arranged between the rough temperature regulator 41 and the supply pipe 11 and, specifically, between the filter 44 and the supply pipe 11, and it performs temperature regulation of the liquid 1 with high accuracy. For example, the fine temperature regulator 45 performs fine regulation of the temperature (temperature stability, temperature uniformity) of the liquid 1 that has drawn from the filter 44 at a high accuracy of approximately ±0.01° C. to ±0.001° C. with respect to the target temperature. In this embodiment, among the plurality of devices that form the temperature regulation apparatus 40, the fine temperature regulator 45 is arranged at the position nearest the substrate P (i.e., the exposure apparatus main body S), which is the subject for the supply of the liquid 1, so it is able to supply the liquid 1 that has been temperature-regulated at high accuracy onto the substrate P.

Note that it is preferable that the filter 44 be arranged between the rough temperature regulator 41 and the fine temperature regulator 45 within the temperature regulation apparatus 40, but it is also possible to arrange it at a different location within the temperature regulation apparatus 40, and it may also be arranged outside the temperature regulation apparatus 40.

The operation of the pure water manufacturing apparatus 30 is controlled by a pure water manufacturing control part 33 that is separate from the control apparatus CONT that controls the operation of the exposure apparatus main body S. In addition, the operation of the temperature regulation apparatus 40 is controlled by a temperature regulation control part 46 that is separate from the control apparatus CONT. In addition, the control apparatus CONT and the pure water manufacturing control part 33 are connected by a first communication apparatus 401, and the control apparatus CONT and the temperature regulation control part 46 are connected by a second communication apparatus 402.

The communication apparatus 400 that includes the first communication apparatus 401 and the second communication apparatus 402 is formed to include, for example, a local area network (LAN), and the control apparatus CONT, the pure water manufacturing control part 33, and the temperature regulation control part 46 are respectively capable of mutually transmitting signals and information via the communication apparatus 400.

The supply pipe 11 of the liquid supply mechanism 10 supplies a liquid 1 that has been temperature-regulated by the temperature regulation apparatus 40 onto the substrate P via a liquid supply member 12, and one end part thereof is connected to the fine temperature regulator 45 of the temperature regulation apparatus 40, and the other end part is connected to the supply flow path 13 of the liquid supply member 12. As discussed above, the supply pipe 11 is arranged at the interior of the chamber apparatus CH, which is air-conditioned by the air-conditioning system 300. The recovery pipe 21 of the liquid recovery mechanism 20 collects the liquid 1 on the substrate P via the recovery ports 24 of the liquid recovery member 22, and the liquid 1 that has been collected through the recovery ports 24 is stored in the liquid recovery apparatus 25 via the recovery flow path 23 of the liquid recovery member 22 and the recovery pipe 21.

The supply pipe 11 and the recovery pipe 21 are connected via a connection pipe 60. The connection pipe 60 is also arranged at the interior of the chamber apparatus CH. One end part of the connection pipe 60 is connected at connection position C1 along the supply pipe 11, and the other end part is connected to connection position C2 along the recovery pipe 21. Also, provided along the supply pipe 11 is the first valve 16, which opens and closes the flow path of this supply pipe 11, provided along the recovery pipe 21 is the second valve 26, which opens and closes the flow path of this recovery pipe 21, and provided along the connection pipe 60 is the third valve 66, which opens and closes the flow path of this connection pipe 60. The first valve 16 is provided on the supply port 14 side of the supply pipe 11 with respect to the connection position C1, and the second valve 26 is provided on the recovery port 24 side of the recovery pipe 21 with respect to the connection position C2. The operation of the respective valves 16, 26, 66, is controlled by control apparatus CONT. In addition, the flow path of the liquid 1 that has drawn from the temperature regulation apparatus 40 is changed by these valves 16, 26, 66. Note that it is preferable that the connection pipe 60 be as near as possible to the supply ports 14 and the recovery ports 24, but it may also be provided outside the chamber CH. In addition, a three-way valve may be arranged at connection position C1 instead of the first valve 16 and the second valve 26 to switch the flow path of the liquid 1 that has drawn from the temperature regulation apparatus 40 to connection position C1.

Also, a temperature measuring apparatus 160, which measures the temperature inside this chamber apparatus CH, is provided at the interior of the chamber apparatus CH. The temperature measurement results of the temperature measurement apparatus 160 are output to the control apparatus CONT.

Figure 3:
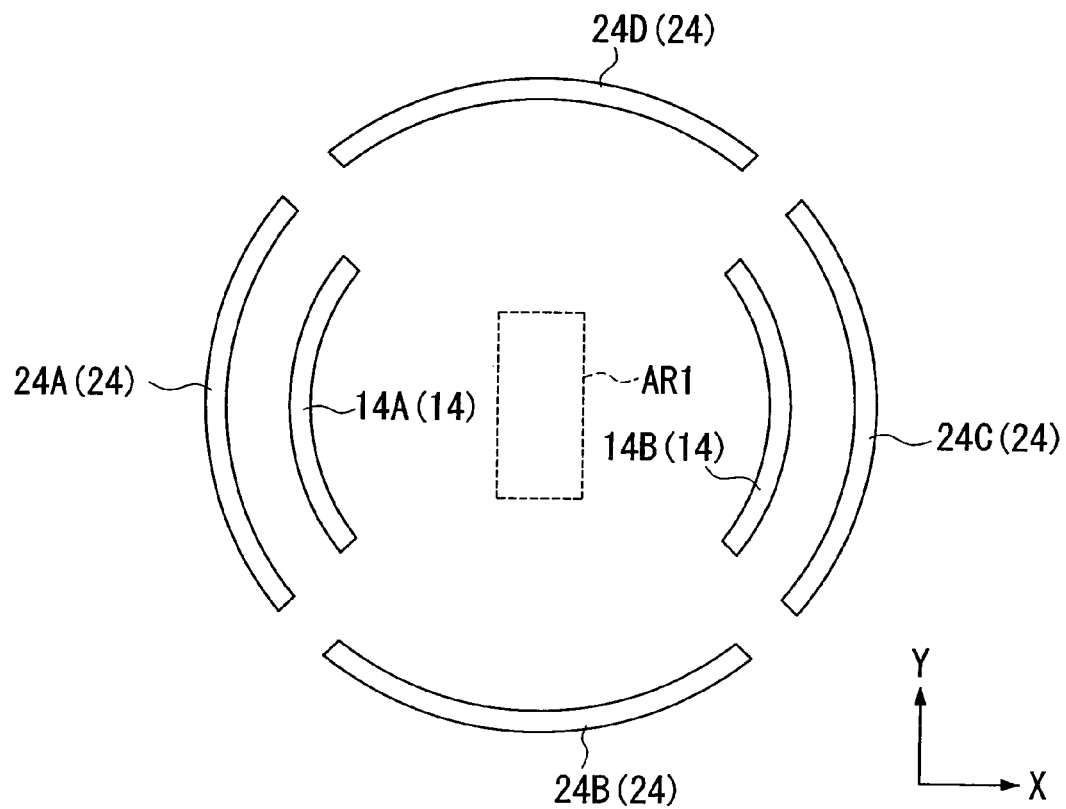
FIG. 3 is a schematic plan view that shows the liquid supply mechanism and the liquid recovery mechanism.

FIG. 3 is a plan view that shows the positional relationship among the supply ports 14 formed on the liquid supply member 12, the recovery ports 24 formed on the liquid recovery member 22, and the projection region AR1 of the projection optical system PL. In FIG. 3, the projection region AR1 of the projection optical system PL is set to a rectangular shape with the Y axis direction (non-scan direction) as the lengthwise direction. In addition, in this embodiment, two supply ports 14 are provided, and a first supply port 14A is provided on one side (−X side) and a second supply port 14B is provided on the other side (+X side) of the scan direction with respect to projection region AR1. That is, the first and second supply ports 14A and 14B are provided near the projection region AR1 and are arranged on both sides thereof so as to interpose the projection region AR1 in relation to the scan direction (X direction). The first and second supply ports 14A, 14B are respectively formed in a slit shape of a prescribed length that is approximately arc-shaped in a planar view. The length of the first and second supply ports 14A, 14B in the Y axis direction is at least longer than the length of the projection region AR1 in the Y axis direction. The liquid supply mechanism 10 is able to simultaneously supply the liquid 1 on both sides of projection region AR1 via the first and second supply ports 14A, 14B. In addition, a plurality (two) of supply flow paths 13 are formed at the interior of the liquid supply member 12 to correspond to the plurality (two) of supply ports 14A, 14B.

In this embodiment, four recovery ports 24 are provided. The four recovery ports 24A-24D are arranged at the outer side of the supply ports 14A, 14B with respect to the projection region AR1, and they are arranged to surround the supply ports 14A, 14B and the projection region AR1. Of the plurality (four) of recovery ports 24A-24D, recovery port 24A and recovery port 24C interpose the projection region AR1 in relation to the X axis direction and they are arranged on both sides thereof, and recovery port 24B and recovery port 24D interpose the projection region AR1 in relation to the Y axis direction and they are arranged on both sides thereof. The supply ports 14A, 14B have a configuration such that they are arranged between the projection region AR1 and recovery ports 24A and 24C. The recovery ports 24A-24D are respectively formed in a slit shape of a prescribed length that is approximately arc-shaped in a planar view. The length of recovery ports 24A and 24C in the Y axis direction is longer than the length of the supply ports 14A, 14B in the Y axis direction. Recovery ports 24B and 24D are also respectively formed to nearly the same length as recovery ports 24A and 24C. In addition, a plurality (four) of recovery flow paths 23 are formed at the interior of the liquid recovery member 22 so as to correspond to the plurality (four) of recovery ports 24A-24D.

In this embodiment, the recovery ports 24 are provided so as to surround the supply ports 14 and the projection region AR1, so it is possible to prevent the liquid 1 from flowing outside the substrate P.

Note that, in this embodiment, the plurality of recovery ports 24A-24D are respectively formed to have nearly the same size (length), but they may also have mutually different sizes. Furthermore, the number of recovery ports 24 is not limited to four, and any number of recovery ports may be provided as long as they are arranged so as to surround the projection region AR1 and the supply ports 14A, 14B. In addition, a further separate recovery port may be provided at the outer side of the recovery ports 24. In addition, there may be a continuous annular recovery port without dividing the recovery port. Furthermore, in FIG. 3, the slit width of the supply ports 14 and the slit width of the recovery ports 24 are nearly the same, but the slit width of the recovery ports 24 may be made larger than the slit width of the supply ports 14, and, conversely, the slit width of the recovery ports may be made smaller than the slit width of the supply ports.

In addition, here, the supply ports 14 of the liquid supply mechanism 10 are of a configuration such that they are provided at both sides of the scan direction (X axis direction) with respect to the projection region AR1, but separate supply ports may be provided at both sides of the non-scan direction (Y axis direction), and these supply ports may be combined to perform liquid supply. Or, the supply ports may be provided in an annular shape so as to surround the entire perimeter of the projection region AR1.

In addition, a liquid immersion region AR2 that is filled with the liquid 1 is within a region that is essentially surrounded by the four recovery ports 24A-24D so that the projection region AR1 is included, and it is formed locally at a portion on the substrate P. Note that the liquid immersion region AR2 may cover at least the projection region AR1, and the entire region surrounded by the four recovery ports 24A-24D need not be the liquid immersion region.

Figure 4:
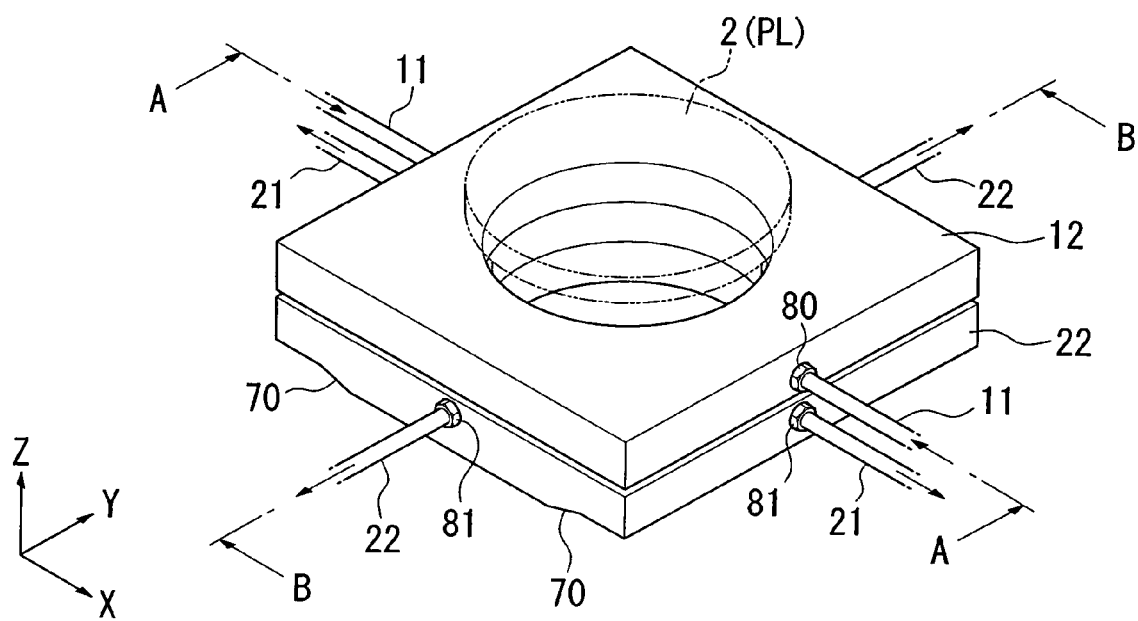
FIG. 4 is a schematic perspective view that shows the liquid supply members and the liquid recovery members.

FIG. 4 is a schematic perspective view of the liquid supply member 12 and the liquid recovery member 22. As shown in FIG. 4, the liquid supply member 12 and the liquid recovery member 22 are respectively annular members provided so as to surround the perimeter of the optical element 2 of the end part of the projection optical system PL, and they are members that are mutually separate and independent. In addition, as described above, the supply pipe 11 is connected to each of the supply flow paths 13 (not shown in FIG. 4), and the recovery pipe 21 is connected to each of the recovery flow paths 23.

Note that the liquid supply member 12 and the liquid recovery member 22 are formed of a metal such as stainless steel, titanium, aluminum, or an alloy that includes these, and the supply flow path 13 and the recovery flow path 23 are formed by electric discharge machining, for example. Preferably, the liquid contact surface of the liquid supply member 12 and the liquid recovery member 22 is electropolished or subjected to insulation oxide film treatment in advance. In addition, the respective members that form the liquid supply mechanism 10 and the liquid recovery mechanism 20, which include the liquid supply member 12 and the liquid recovery member 22, may be formed using a synthetic resin such as polytetrafluoroethylene.

In this embodiment, a plurality of supply ports 14 and supply pipes 11 are connected to one temperature regulation apparatus 40, but a plurality (here, two) of temperature regulation apparatuses 40 that correspond to the number of supply ports 14 (supply pipes 11) may be provided, and the respective recovery ports 14 (supply pipes 11) may be respectively connected to the plurality of temperature regulation apparatuses 40. Similarly, in addition to a configuration in which a plurality of recovery ports 24 and recovery pipes 21 are connected to one liquid recovery apparatus 25, a plurality (here, four) of liquid recovery apparatuses 25 that correspond to the number of recovery ports 24 (recovery pipes 21) may be provided, and the respective recovery ports 24 (recovery pipes 21) may be respectively connected to the plurality of liquid recovery apparatuses 25.

Figure 5:
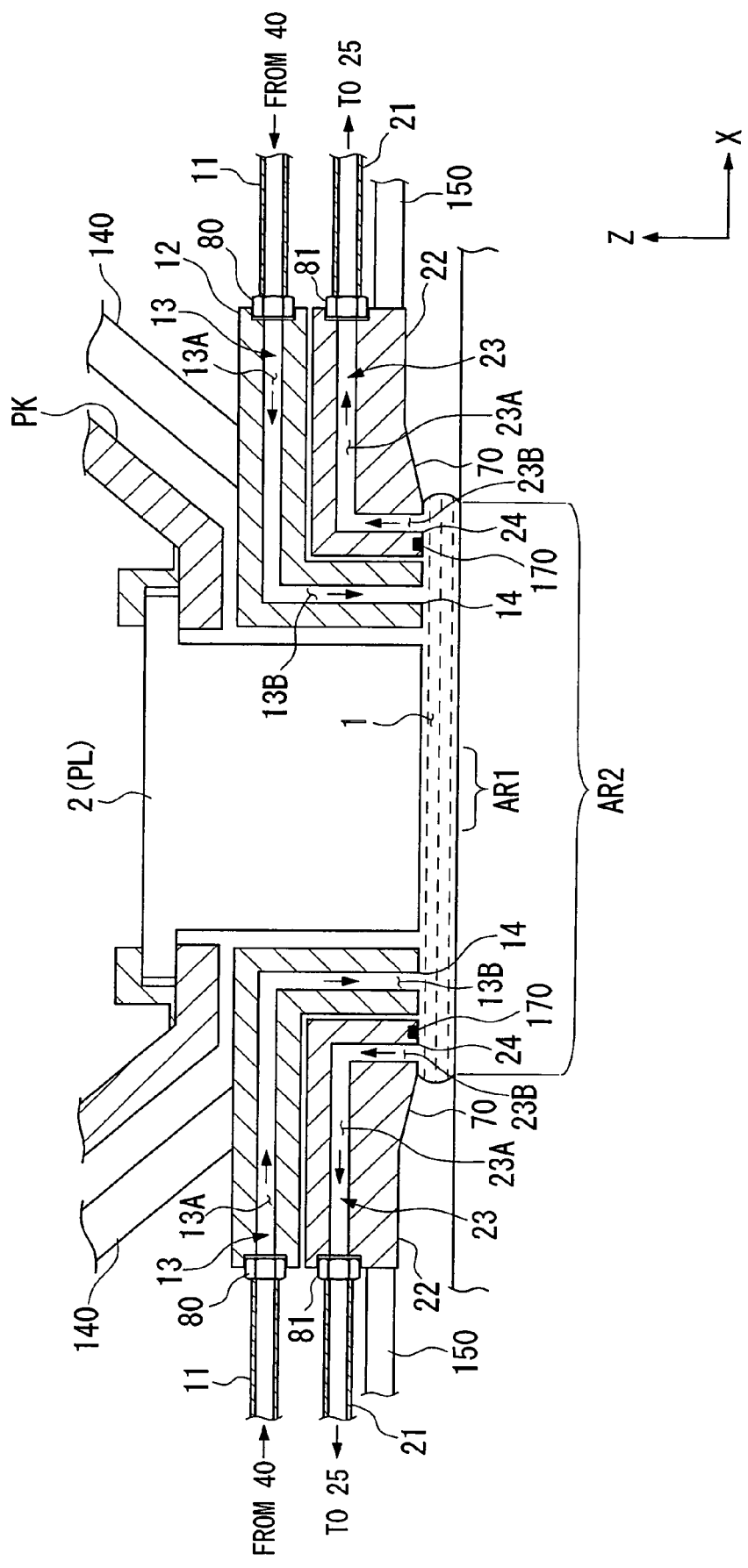
FIG. 5 is a cross-sectional view showing enlarged principal parts of the exposure apparatus of the same embodiment.
Figure 6:
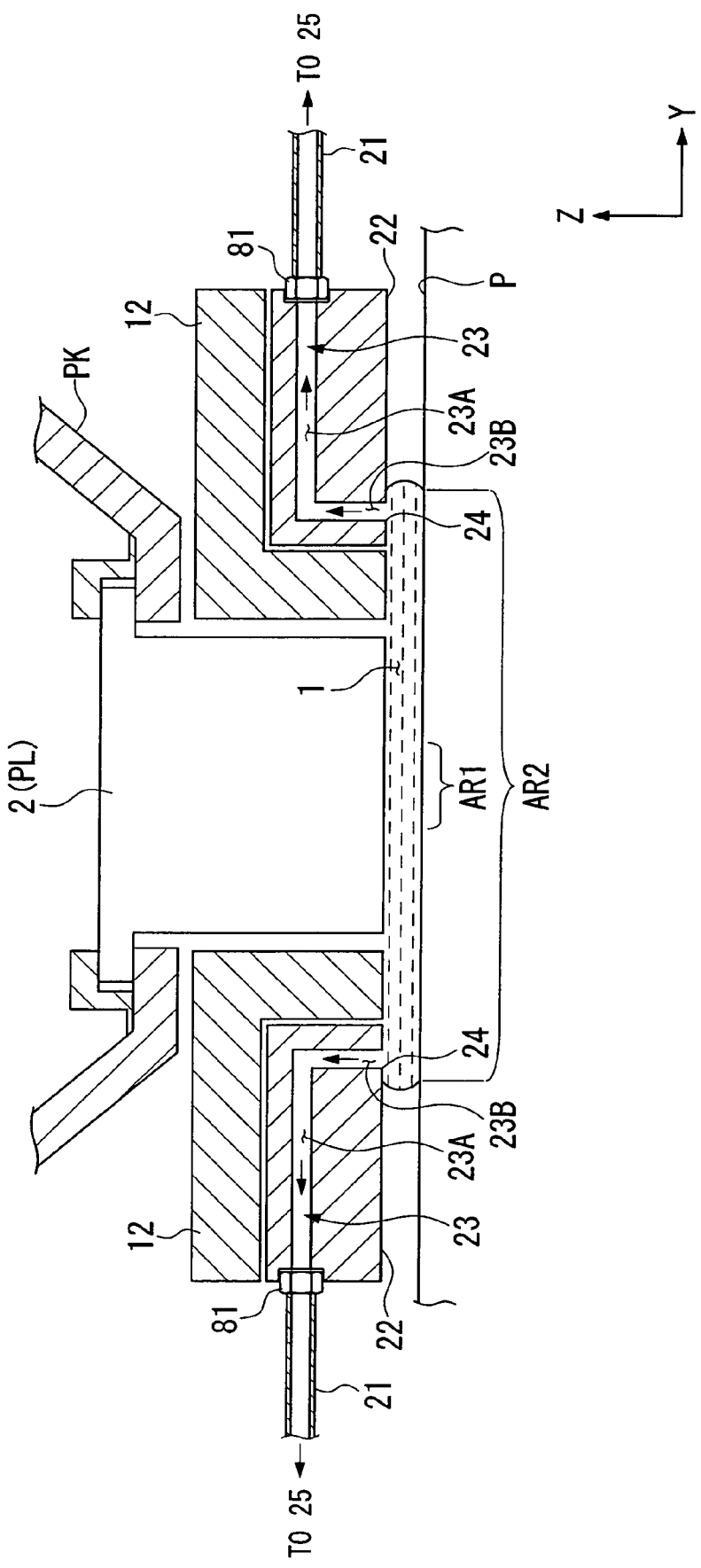
FIG. 6 is a cross-sectional view showing enlarged principal parts of the exposure apparatus of the same embodiment.

FIG. 5 is a sectional view along line A-A in FIG. 4, and FIG. 6 is a sectional view along line B-B in FIG. 4. Note that, in the explanation below, of the liquid supply member 12 and the liquid recovery member 22, the supply flow path 13 and the recovery flow path 23 provided on the +X side of the projection optical system PL are explained, but the supply flow path 13 provided on the −X side of the projection optical system PL, the recovery flow path 23 on the −X side, the recovery flow path 23 on the −Y side, and recovery flow path 23 on the +Y side of the projection optical system PL all have equivalent configurations.

In FIG. 5, the supply flow path 13 is connected via joints 80 to the supply pipe 11, and it has horizontal flow path 13A, which causes the liquid 1 to flow in a nearly horizontal direction, and vertical flow path 13B, which causes the liquid 1 to flow in a nearly vertical direction. Horizontal flow path 13A is formed in a taper shape that gradually widens from the supply pipe 11 to the flow path 13B (projection optical system PL) side in a planar view. The liquid 1 that has drawn from the temperature regulation apparatus 40 flows into the supply path 13 via the supply pipe 11. The liquid 1 that has flowed into the supply path 13 flows in a nearly horizontal direction (XY plane direction) in horizontal flow path 13A, and after it has turned at nearly a right angle, it flows in the vertical direction (−Z direction) in vertical flow path 13B, and it is supplied onto the substrate P from above the substrate P via the supply ports 14.

In FIG. 5 and FIG. 6, the recovery flow path 23 is connected via joints 81 to the recovery pipe 21, and it has a horizontal flow path 23A, which causes the liquid 1 to flow in a nearly horizontal direction, and a vertical flow path 23B, which causes the liquid 1 to flow in a nearly vertical direction. Horizontal flow path 23A is formed in a taper shape that that gradually narrows from the vertical flow path 23B (projection optical system PL) to the recovery pipe 21 side in a planar view. By driving the liquid recovery apparatus 25 that has a vacuum system, the liquid 1 on the substrate P flows in vertically upward (+Z direction) to the vertical flow path 23B of the recovery flow path 23 via the recovery ports 24 provided above that substrate P.

The liquid 1 that has flowed into the vertical flow path 23B of the recovery flow path 23 has the orientation of its flow changed to the horizontal direction, and it flows in a nearly horizontal direction through horizontal flow path 23A. After that, it is sucked and stored in the liquid recovery apparatus 25 via the recovery pipe 21.

In the liquid recovery member 22, a liquid trap surface 70 of a prescribed length, which catches the liquid 1, is formed on the lower surface (the surface that faces the substrate P side) of the outer side of the recovery ports 24 with respect to the projection optical system PL. The trap surface 70 is a surface that is inclined with respect to the XY plane, and it is inclined so as to be further (so as to face upward) from the surface of the substrate P as it goes away from the projection region AR1 (liquid immersion region AR2). In this embodiment, trap surfaces 70 are respectively provided on both sides of the scan direction (X axis direction) with respect to the projection region AR1. Lyophilic treatment is performed on the trap surfaces 70. The film (photoresist, anti-reflection film, etc.) with which the surface of the substrate P is coated is normally water repellent (liquid repellent), so the liquid 1 that has flowed out to the outer side of the recovery ports 24 is captured by the trap surfaces 70. Note that the liquid 1 in this embodiment is water that has high polarity, so, for hydrophilic treatment (lyophilic treatment) with respect to the trap surfaces 70, a thin film is formed of a substance with a molecular structure that has a high polarity, such as alcohol, so that hydrophilicity is provided with respect to these trap surfaces 70. Specifically, in the case where water is used as the liquid 1, for the trap surfaces 70, treatment in which a substance with a molecular structure that has a high polarity, such as an OH group, is arranged on the surface is preferable.

Note that, here, the configuration is such that trap surfaces 70 are provided only on both sides in the scan direction of the projection region AR1 of the lower surface of the liquid recovery member 22, but it is also possible to make it a configuration in which they are provided in the non-scan direction with respect the projection region AR1. On the other hand, since it is at both sides in the scan direction that the liquid 1 flows easily, even if it is a configuration in which trap surfaces 70 are provided only at both sides in the scan direction of the projection region AR1, the liquid 1 that is attempting to flow out is captured well. Also, there is no need for the trap surface 70 to be a flat surface, and it may also be a shape obtained by combining a plurality of flat surfaces for example. Or, the trap surface 70 may be a curved surface shape, and may also be subjected to surface area expansion treatment, specifically, rough surface treatment.

Note that it is possible to perform lyophilic treatment (hydrophilic treatment) on the inner wall surfaces in the vicinity of the recovery ports 24 of recovery path 23 in order to smoothly perform liquid collection. The liquid 1 in this embodiment is water that has high polarity, so, for hydrophilic treatment (lyophilic treatment) with respect to the recovery ports 24, a thin film is formed of a substance with a molecular structure that has a high polarity, such as alcohol, to provide hydrophilicity to the inner wall surfaces of the recovery path 23 in the vicinity of the recovery ports 24, or hydrophilicity can be provided by emitting ultraviolet rays (UV). Note that, other than the vicinity of the recovery ports 24, it is possible to implement lyophilic treatment on the surfaces of the flow paths of the liquid supply mechanism 10 and the liquid recovery mechanism 20 through which the liquid 1 flows.

In addition, a liquid temperature measuring apparatus 170, which measures the temperature of the liquid 1 supplied onto the substrate P via the supply pipe 11 and a supply flow path 13, is provided at a position of the lower surface of the liquid recovery member 22 that comes into contact with the liquid 1 of the liquid immersion region AR2 formed on the substrate P. The temperature measurement results of the liquid temperature measuring apparatus 170 are output to the control apparatus CONT.

Note that the liquid temperature measuring apparatus 170 may be provided at a position that is able to come into contact with the liquid 1 of the liquid immersion region AR2 formed on the substrate P, for example, the lower surface of the liquid supply member 12. On the other hand, when the liquid temperature measuring apparatus 170 is provided in the vicinity of the projection region AR1, there is a possibility that the flow of the liquid 1 of the liquid immersion region AR2 will be disturbed by the presence of that liquid temperature measuring apparatus 170, so it is preferable that the installation position of the liquid temperature measuring apparatus 170 be a position that is as far as possible from the projection region AR1 in a range in which contact with the liquid 1 of the liquid immersion region AR2 is possible.

In addition, the liquid supply member 12 and the liquid recovery member 22 are mutually independent and separate members, and, as discussed above, the liquid supply member 12 is supported at the lower side step part 102B of the main column 102 via the first support member 140, and the liquid recovery member 22 is supported on a base 108 via a second support member 150. Also, the liquid supply member 12 is supported by a first support member 140 in a status in which it is separated from the projection optical system PL (optical element 2), and, through this, the optical element 2 of the projection optical system PL and the liquid supply member 12 are vibrationally separated. In addition, as discussed above, the liquid recovery member 22 is supported by a second support member 150 in a status in which it is separated from the projection optical system PL (optical element 2), and, through this, the optical element 2 of the projection optical system PL and the liquid recovery member 22 are vibrationally separated. Therefore, it is possible to prevent the vibration generated in liquid recovery mechanism 10 or liquid recovery mechanism 20 from being transmitted to the projection optical system PL. Note that it is preferable that water repellence treatment be performed on the surface that opposes the optical element 2 of the liquid supply member 12 and on the surface that opposes the liquid supply member 12 of the optical element 2. By doing this, it is possible to prevent the liquid 1 from penetrating between the liquid supply member 12 and the optical element 2. Similarly, it is preferable that water repellence treatment be performed on the surface that opposes the liquid recovery member 22 of the liquid supply member 12 and on the surface that opposes the liquid supply member 12 of the liquid recovery member 22. An example of water repellence treatment is coating treatment that uses a material that has water repellent properties, for example. Examples of the material that has water repellent properties are flourine group compounds, silicon compounds, or synthetic resins such as polyethylene. Also, the thin film for surface treatment may be a single layer film or a film consisting of plurality of layers.

Next, the method of exposing the substrate P with the pattern image of the mask M using the exposure apparatus EX discussed above will be explained while referring to the schematic drawings shown in FIGS. 7A-7D.

Figure 7A:
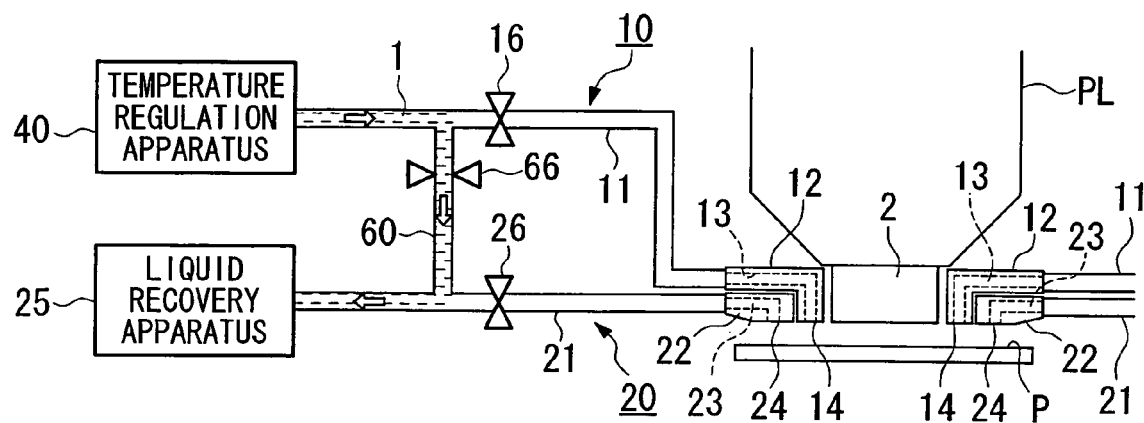
FIG. 7A is a schematic view for explaining the operation of the exposure apparatus of the same embodiment.

The liquid (pure water) 1 manufactured by the pure water manufacturing apparatus 30 of the liquid supply mechanism 10 is supplied to the supply pipe 11 after being regulated to the desired temperature by the temperature regulation apparatus 40, for example, to a temperature equivalent to that of the interior of the chamber apparatus CH. Here, the pure water manufacturing apparatus 30 and the temperature regulation apparatus 40 of the liquid supply mechanism 10 are driving both when liquid supply is performed and when liquid supply is not necessary. Furthermore, when liquid supply is not necessary, such as before exposure processing is performed, the control apparatus CONT stops the supply of the liquid 1 from the supply pipe 11 to the liquid supply member 12 (and, in turn, the substrate P), so, as shown in FIG. 7A, the flow path from the supply pipe 11 to the liquid supply member 12 (substrate P) is closed by the first valve 16. At this time, the flow path of the recovery pipe 21 is also closed by the second valve 26. In addition, when the supply of the liquid 1 from the supply pipe 11 to the liquid supply member 12 (substrate P) is stopped, the control apparatus CONT opens the third valve 66 of the connection pipe 60 to open the flow path of the connection pipe 60 and switches the flow path so that the liquid 1 that has flowed into supply pipe 11 from the temperature regulation apparatus 40 flows to the recovery pipe 21 via the connection pipe 60. Through this, when liquid supply is not necessary, the liquid 1 that has been temperature-regulated by the temperature regulation apparatus 40 is stored in the liquid recovery apparatus 25 via the recovery pipe 21 without being supplied onto the substrate P. Note that, at this time, the flow per unit time of the liquid 1 may be reduced in comparison with that during liquid immersion exposure. Specifically, if it is possible to continue the operation of the pure water manufacturing apparatus 30 and the temperature regulation apparatus 40 to continue to cause the liquid 1 to flow to the supply flow path, the flow of the liquid 1 may be small.

Figure 7B:
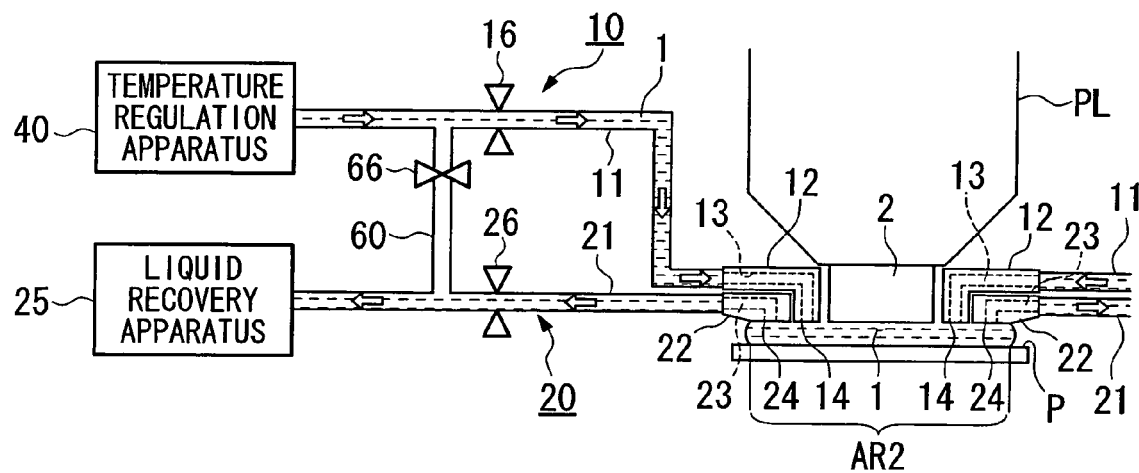
FIG. 7B is, similarly, a schematic view for explaining the operation of the exposure apparatus of the embodiment.

As shown in FIG. 7B, when performing liquid immersion exposure processing, the control apparatus CONT opens the first valve 16 to open the flow path from the supply pipe 11 to the liquid supply member 12 (substrate P) as it closes the flow path of the connection pipe 60 by means of the third valve 66. Through this, the liquid 1 that has been temperature-regulated by the temperature regulation apparatus 40 is supplied onto the substrate P via the supply pipe 11 and the supply ports 14 of the liquid supply member 12. At this time, the control apparatus CONT opens the second valve 26 to open the flow path from the recovery ports 24 of the liquid recovery member 22 to the recovery pipe 21 (i.e., the liquid recovery apparatus 25). Through this, the liquid 1 on the substrate P is stored in the liquid recovery apparatus 25 via the recovery ports 24, the recovery flow path 23 and the recovery pipe 21. Through the operations of supply and recovery of the liquid 1 by the liquid supply mechanism 10 and the liquid recovery mechanism 20, the liquid 1 that has been supplied from the temperature regulation apparatus 40 via the supply pipe 11 forms the liquid immersion region AR2 on the substrate P well.

Here, the liquid supply operation of the liquid supply mechanism 10, which includes a pure water manufacturing apparatus 30 and a temperature regulation apparatus 40, is controlled by the control apparatus CONT or by a pure water manufacturing control part 33 and a temperature regulation control part 46 connected to this control apparatus CONT via a communication apparatus 400, and the liquid supply mechanism 10 supplies a prescribed amount per unit time of the liquid 1 onto the substrate P by means of the supply ports 14 provided above the substrate P. In addition, the liquid recovery operation of the liquid recovery mechanism 20, which includes a liquid recovery apparatus 25, is controlled by the control apparatus CONT, and the liquid recovery mechanism 20 collects a prescribed amount per unit time of the liquid 1 via the recovery ports 24 provided above the substrate P.

As shown in FIG. 7A, even when the supply of the liquid 1 onto the substrate P is stopped, the pure water manufacturing apparatus 30 and the temperature regulation apparatus 40 continue the driving thereof, so as shown in FIG. 7B, it is possible to immediately supply the liquid 1 that has been regulated to the desired temperature onto the substrate P merely by switching the flow path using valves 16, 26 and 66 to supply the liquid 1 onto the substrate P. That is, if the driving of the pure water manufacturing apparatus 30 and the temperature regulation apparatus 40 are stopped while stopping the supply of the liquid 1 onto the substrate P, inconveniences occur at the time of resumption of the supply of the liquid 1 and/or at the time of resumption of the driving of the temperature regulation apparatus 40, such as the temperature of the liquid that has drawn from the temperature regulation apparatus 40 changing slightly, and it being necessary to provide wait time for the liquid to reach the desired temperature. However, even in the case where the liquid supply operation is resumed after stopping the supply of the liquid 1 onto the substrate P, by causing the liquid 1 to flow into the supply pipe 11 and maintaining the driving of the temperature regulation apparatus 40 and the inflow of the liquid 1 to the supply pipe 11 even when the supply of the liquid 1 is stopped, it is possible to supply liquid 1 of the desired temperature with good efficiency without providing a wait time (without reducing throughput).

In addition, when the supply of the liquid 1 is stopped, the liquid 1 that has flowed into the supply pipe 11 is made to flow to the recovery pipe 21 using valves 16, 26 and 66, so it is possible to prevent the outflow of the liquid 1, and it is possible to prevent the occurrence of inconveniences due to the outflow of the liquid 1, such as the occurrence of rust of the peripheral mechanical parts and fluctuations in the environment (humidity, etc.) where the substrate P is placed.

Here, the control apparatus CONT supplies the liquid 1 for the prescribed period of time (or the prescribed amount) via the supply pipe 11 between the start of the supply of the liquid 1 onto the substrate P and the start of liquid immersion exposure processing (i.e., until exposure light is emitted onto the substrate P). Through this, the supply pipe 11, the supply flow path 13, and the vicinity of the supply ports 14 are washed (flushed), and the temperature of the supply pipe 11, the supply flow path 13, and the vicinity of the supply ports 14 is stabilized. Note that, at this time, the amount per unit time of the liquid 1 may be increased in comparison with that during the liquid immersion exposure. Through this, a higher washing effect can be expected, and the temperature of the supply pipe 11, the supply flow path 13, and the vicinity of the supply ports 14 can be set to the prescribed temperature (the same temperature as the liquid 1) in a short period of time. In other words, the supply of the liquid 1, that has been temperature-regulated by the fine temperature regulator 45, onto the substrate P continues for a prescribed time before liquid immersion processing is performed, and after the supply pipe 11, etc. become a temperature stable condition, the liquid immersion exposure processing is started. In that case, in order to reach the temperature stable condition in a short period of time, the temperature-regulated liquid 1 may be caused to flow at a larger volume than that during the liquid immersion exposure.

Figure 7C:
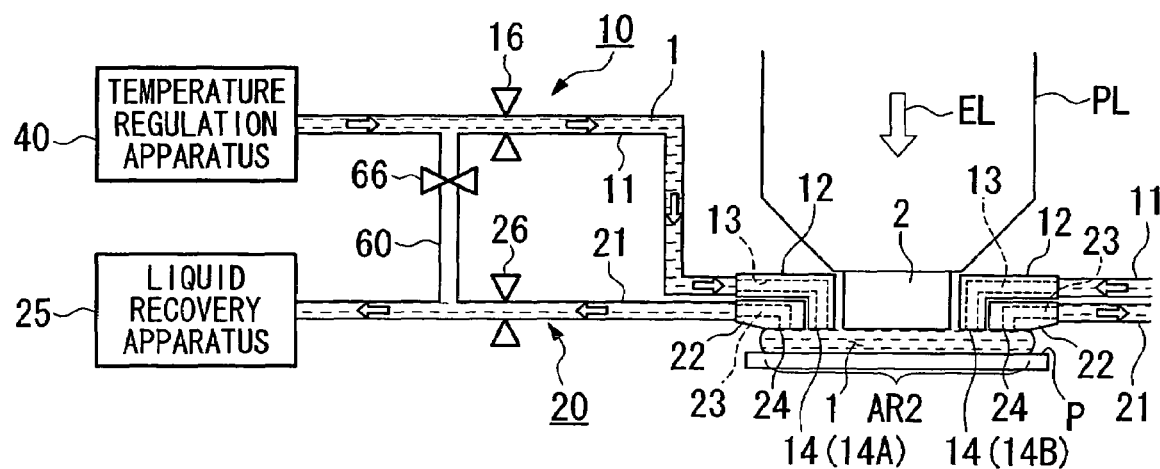
FIG. 7C is, similarly, a schematic view for explaining the operation of the exposure apparatus of the embodiment.

After a liquid immersion region AR2 has been formed on the substrate P, the control apparatus CONT emits exposure light EL from the illumination optical system IL. The exposure light EL that has been emitted from the illumination optical system IL and has passed through the mask M is provided to the image plane side of the projection optical system PL, and through this, as shown in FIG. 7C, the substrate P is exposed with the pattern of the mask M via the projection optical system PL and the liquid 1 of the liquid immersion region AR2. The control apparatus CONT controls the operation of supplying the liquid onto the substrate P by means of the liquid supply mechanism 10 and the operation of collecting the liquid on the substrate P by means of the liquid recovery mechanism 20 when the exposure light EL is emitted to the image plane side of the projection optical system PL, that is, during the operation of the exposure of the substrate P. Through this, the liquid immersion region AR2 is formed well on the substrate P.

The exposure apparatus EX in this embodiment projects the pattern image of the mask M onto the substrate P while moving the mask M and the substrate P in the X axis direction (scan direction) so as to expose the substrate P, and, during scanning exposure, the pattern image of a portion of the mask M is projected to a rectangular projection exposure region AR1 immediately below the end part of the projection optical system PL, and the substrate P is moved at a velocity $\beta \cdot V$ ($\beta$ is the projection magnification) in the +X direction (or the −X direction) via the substrate stage PST in synchronization with the mask M moving in the −X direction (or the +X direction) at a velocity V with respect to the projection optical system PL. A plurality of shot regions are set on the substrate P, and after the end of exposure to one shot region, the next shot region shifts to the scan start position by means of the stepping movement of the substrate P, and thereafter scanning exposure processing with respect to the respective shot regions is sequentially performed while moving the substrate P using a step and scan system.

In addition, the liquid 1 supplied onto the substrate P flows under the projection optical system PL depending on the movement of the substrate P. For example, when the substrate P is moving in the +X direction during exposure of a certain shot region, the liquid 1 flows under the projection optical system PL at the nearly same velocity as the substrate P in the +X direction, which is the same direction as that of the substrate P.

In this embodiment, during the exposure operation, the liquid supply mechanism 10 simultaneously performs supply of the liquid 1 from the supply ports 14A, 14B on both sides of the projection region AR1 onto the substrate P. Through this, the liquid 1 that has been supplied onto the substrate P from the supply ports 14A, 14B expands well to wet the space between the substrate P and the lower end surface of the optical element 2 at the end part of the projection optical system PL, and the liquid immersion region AR2 is formed in an area that is at least wider than the projection region AR1.

Here, for example, in a case where the substrate P moves in the +X direction, the amount of liquid that moves to the +X side with respect to the projection region AR1 increases, and there is a possibility that it will flow out to the outer side of the substrate P without all being collected through the recovery ports 24C. However, since the liquid 1 that moves to the +X side is captured by the trap surface 70 provided on the lower surface of the +X side of the liquid recovery member 22, it is possible to prevent the liquid 1 from flowing out.

In any case, in this embodiment, a local liquid immersion system which forms a liquid immersion region AR2 on a portion of the substrate P is applied, and it is configured to suck and recover the liquid 1 on the substrate P from above the substrate P via the recovery ports 24 as the liquid recovery mechanism 20 by using the vacuum system of the liquid recovery apparatus 25. In this case, in the liquid recovery mechanism 20, there is a possibility that circumstances in which the liquid 1 on the substrate P will be collected together with the surrounding gas thereof (so that the surrounding gas is taken in) will occur. A situation in which the liquid 1 intermittently flows into the recovery flow path 23 is generated by the liquid recovery mechanism 20 collecting the liquid 1 along with the surrounding gas thereof via the recovery ports 24. In that case, the liquid 1 that has flowed into the recovery flow path 23 is divided into grained form (droplets), and those droplets collide with the recovery flow path 23 and the recovery pipe 21. This is thought to be a cause of the occurrence of noise and vibration, and there is concern that exposure accuracy will deteriorate due to the noise and vibration produced in this way.

However, the liquid recovery member 22 of the liquid recovery mechanism 20 and the projection optical system PL are vibrationally separated via the vibration isolating apparatus 106, so the vibration generated during liquid recovery is not transmitted to the projection optical system PL and measuring systems such as the laser interferometer 56, the focus detection system, and the alignment system. Therefore, it is possible to prevent the occurrence of the inconvenience such as deterioration of the pattern image due to the vibration of the projection optical system, and since the liquid recovery member 22 of the liquid recovery mechanism 20 and the substrate stage PST are vibrationally separated via the vibration isolating apparatus 110, it is possible to perform positional control of the substrate stage (substrate P) with good accuracy, so it is possible to project the pattern image onto the substrate with good accuracy. That is, the liquid supply member 12 of the liquid supply mechanism 10 is supported via the first support member 140 on the main frame 102 that is vibrationally separated from the stage base 112 that supports the substrate stage PST, and the liquid recovery member 22 of the liquid recovery mechanism 20 is supported via the second support member 150 on the base 108, so the liquid supply mechanism 10 and the liquid recovery mechanism 20 are also vibrationally separated from the stage base 112. Therefore, the vibration that occurs during liquid supply or during liquid recovery is also not transmitted to the stage base 112, and it is possible to prevent the occurrence of problems which may degrade the substrate stage PST positioning accuracy or movement accuracy.

Note that it is also possible to employ a configuration in which a porous member consisting of, for example, porous ceramics or a sponge-shaped member, or an aggregate of capillaries is provided for the recovery ports 24. Through this, it is also possible to reduce problems in which large noise and vibration are generated when the liquid 1 is collected. In a case where the size of the collected droplets is large, the force (impulse) when they strike the inner walls of the recovery path and the recovery pipe becomes large, and the noise and vibration generated is also thought to become large. Therefore, by arranging porous members or capillaries at the interior of the recovery ports 24, it is possible to perform recovery in a status in which the size of the droplets of liquid collected from the recovery ports 24 has been made smaller (narrower). For this reason, it is possible to reduce the force (impulse) when the droplets strike the inner walls of the recovery path and the recovery pipe, so it is also possible to reduce the generated noise and vibration.

During liquid immersion exposure, the temperature of the interior of the chamber apparatus CH is monitored by a temperature measuring apparatus 160 provided at the interior of the chamber apparatus CH, and the temperature of the liquid 1 of the liquid immersion region AR2 is monitored by the liquid temperature measuring apparatus 170 attached to the lower surface of the liquid recovery member 22. In addition, the measurement results of the temperature measuring apparatus 160 and the measurement results of the liquid temperature measuring apparatus 170 are constantly or periodically output to the control apparatus CONT. The control apparatus CONT communicates the respective temperature measurement results of the temperature measuring apparatus 160 and the liquid temperature measuring apparatus 170 to the temperature regulation control part 46 via the communication apparatus 400 (402). The temperature regulation control part 46 controls temperature regulation of the liquid 1 by the temperature regulation apparatus 40 (fine temperature regulator 45) so that the liquid 1 of the liquid immersion region AR2 comes to the desired temperature based on the measurement results of the temperature measuring apparatus 160 and the measurement results of the liquid temperature measuring apparatus 170 obtained via the communication apparatus 402. Here, the temperature regulation control part 46 (or the control apparatus CONT) may, for example, take into account the respective measurement results of the temperature measuring apparatus 160 and the liquid temperature measuring apparatus 170 to control the temperature regulation of the temperature regulation apparatus 40 (fine temperature regulator 45). Or, the temperature regulation control part 46 (or the control apparatus CONT) may also control temperature regulation of the liquid 1 by the temperature regulation apparatus 40 (fine temperature regulator 45) based on one of the measurement results from among the measurement results of the temperature measuring apparatus 160 and the measurement results of the liquid temperature measuring apparatus 170.

Note that, in this embodiment, the liquid temperature measuring apparatus 170 is attached to the lower surface of the liquid recovery member 22, and it measures the temperature of the liquid 1 that is supplied onto the substrate P from the supply pipe 11 via the supply path 13 and the supply ports 14, but, for example, the liquid temperature measuring apparatus 170 may also be provided at the interior of the supply pipe 11 and measure the temperature of the liquid 1 within the supply pipe 11. In this case as well, the temperature measurement results of the liquid 1 inside the supply pipe 11 are output to the control apparatus CONT, and the control apparatus CONT communicates the temperature measurement results thereof to the temperature regulation control part 46 via the communication apparatus 402. The temperature regulation control part 46 controls the temperature regulation of the temperature regulation apparatus 40 based on the temperature measurement results of the liquid 1 inside the supply pipe 11 obtained via the communication apparatus 402. Of course, liquid temperature measuring apparatuses 170 may be respectively provided at a plurality of positions, such as a position that comes into contact with the liquid 1 of the liquid immersion region AR2, the interior of the supply pipe 11, etc., and temperature regulation by the temperature regulation apparatus 40 may be controlled based on the respective temperature measurement results of this plurality of liquid temperature measuring apparatuses 170. In this case as well, the prescribed computation processing such as averaging may be performed in relation to the respective measurement results of this plurality of liquid temperature measuring apparatuses 170, and temperature regulation by the temperature regulation apparatus 40 may be controlled based on the processing results thereof. Similarly, a plurality of temperature measuring apparatuses 160 that measure the temperature of the interior of the chamber apparatus CH may be provided, and temperature regulation by the temperature regulation apparatus 40 may be controlled based on the respective temperature measurement results of this plurality of temperature measuring apparatuses 160 after computation processing such as averaging the temperature measurement results has been performed, depending on the case.

Figure 7D:
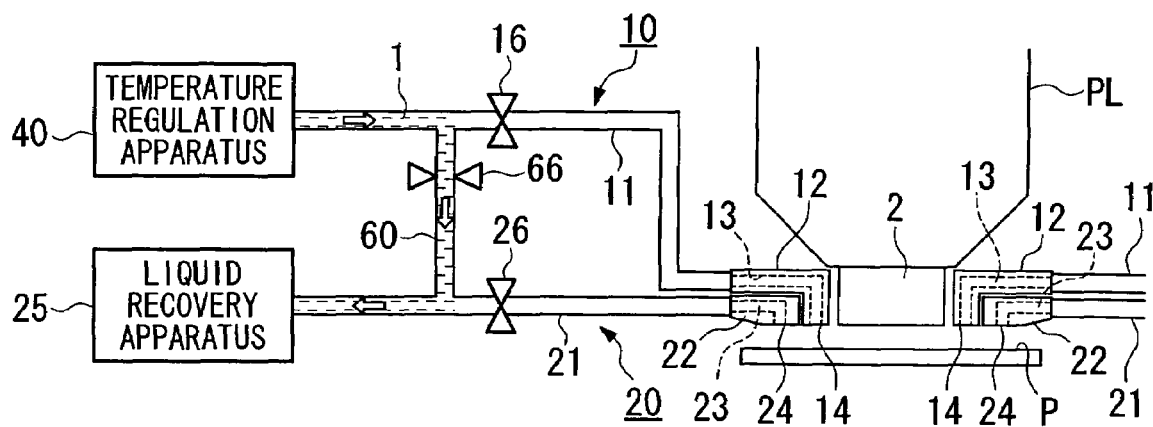
FIG. 7D is, similarly, a schematic view for explaining the operation of the exposure apparatus of the embodiment.

After liquid immersion exposure processing has ended, the control apparatus CONT uses the first valve 16 to close the flow path of the supply pipe 11 and stop the supply of the liquid 1 from the supply pipe 11 to the liquid supply member 12 (consequently, to the substrate P). At this time as well, driving of the pure water manufacturing apparatus 30 and the temperature regulation apparatus 40 is maintained, and the temperature regulated liquid 1 continues to be sent out from the temperature regulation apparatus 40. In addition, the control apparatus CONT opens the second valve 26 for a prescribed period of time to open the flow path of the recovery pipe 21 even after supply of the liquid 1 onto the substrate P has been stopped. Through this, it is possible to collect the liquid 1 that remains on the substrate P and on the substrate stage PST via the recovery ports 24 after liquid immersion exposure processing. Note that when the remaining liquid 1 is collected, the substrate stage PST may be relatively moved with respect to the recovery ports 24. Then, after the liquid 1 that is remaining on the substrate P and on the substrate stage PST has been collected, in a state where the supply of the liquid 1 onto the substrate P via the supply pipe 11 has been stopped, the control apparatus CONT, as shown in FIG. 7D, closes the flow path of the recovery pipe 21 using the second valve 26 and opens the third valve 66 to open the flow path of the connection pipe 60, thereby switching the flow path so that the liquid 1 that has flowed into the supply pipe 11 from the temperature regulation apparatus 40 flows to the recovery pipe 21 via the connection pipe 60. Through this, when liquid supply is not necessary, the liquid 1 that has been temperature-regulated by the temperature regulation apparatus 40 is stored in the liquid recovery apparatus 25 via the recovery pipe 21 without being supplied onto the substrate P. Note that the amount of liquid supplied from the temperature regulation apparatus 40 at such times as when liquid supply is not necessary may be less than that during liquid immersion exposure.

As explained above, in the case where the liquid 1 that has been temperature-regulated by the temperature regulation apparatus 40 is supplied onto the substrate P via the supply pipe 11, when the supply of the liquid 1 is stopped, the liquid 1 that has flowed into the supply pipe 11 is caused to flow to the recovery pipe 21, that is, the liquid 1 is not caused to flow out, so it is possible to prevent the occurrence of the inconvenience in which there is fluctuation in the temperature of the supplied liquid accompanying driving and stopping of the driving of the temperature regulation apparatus 40 and inflow and stopping of the inflow of the liquid 1 to the supply pipe 11. In particular, as in this embodiment, in the case where highly accurate temperature regulation of, for example, ±0.01° C. with respect to the target temperature is required, when driving and stopping of driving of the fine temperature regulator 45 are repeated, there is a strong possibility of it no longer being possible to temperature-regulate the liquid 1 with high accuracy. However, as in this embodiment, even when the supply of the liquid 1 is stopped, it is possible to maintain the liquid 1 at the prescribed temperature with high accuracy, while preventing outflow of the liquid 1, by maintaining the driving of the temperature regulation apparatus 40, which includes the fine temperature regulator 45, and switching the flow path so that the liquid 1 that has drawn from that temperature regulation apparatus 40 flows to the recovery pipe 21.

In addition, the temperature regulation apparatus 40 has a rough temperature regulator 41 and a fine temperature regulator 45, so it is possible to temperature-regulate and supply the liquid 1 with high accuracy, and it is possible to maintain high exposure accuracy. Also, a degassing apparatus 43 for reducing the gas dissolution concentration in the liquid 1 is provided on the temperature regulation apparatus 40, so it is possible to supply this liquid 1 after adequately suppressing the occurrence of bubbles in the liquid 1, and it is possible to prevent the generation of bubbles from the liquid 1 of the liquid immersion region AR2. In addition, even assuming bubbles were to occur in the flow path, through which the liquid 1 flows, such as the lower surface of the projection optical system PL or the substrate P surface, since a liquid 1 for which the occurrence of bubbles has been adequately suppressed flows through the flow path, the liquid 1 is also able to absorb and remove the bubbles that have occurred in this flow path. In this way, it is possible to cause bubbles not to be present in the liquid 1 of the liquid immersion region AR2, so it is possible to prevent deterioration of the pattern image attributable to the bubbles, and it is possible to maintain high exposure accuracy. In addition, by arranging the degassing apparatus 43 between the rough temperature regulator 41 and the fine temperature regulator 45, the degassing apparatus 43 performs degassing processing of the liquid 1 that has been temperature-regulated by the rough temperature regulator 41, so it can be perform degassing well. Also, it is possible to supply the liquid 1 via the supply pipe 11 after the liquid has been degassed by the degassing apparatus 43 and temperature-regulated at high accuracy by the fine temperature regulator 45, and it is possible to perform exposure processing via the liquid 1 that has been temperature-regulated to have a desired temperature.

In addition, temperature regulation of the liquid 1 by the temperature regulation apparatus 40 is controlled based on the measurement results of the temperature measuring apparatus 160 that measures the temperature inside the air-conditioned chamber apparatus CH, so it is possible to supply a liquid 1 that has been temperature-regulated at high accuracy while taking into account the temperature environment within the chamber apparatus CH. Therefore, it is possible to perform exposure processing with good accuracy via the liquid 1 that has been temperature-regulated to have a desired temperature.

In addition, the liquid recovery mechanism 20 (the liquid recovery member 22) is vibrationally separated from the projection optical system PL, so even if vibration were to occur in the liquid recovery mechanism 20 (the liquid recovery member 22), that vibration would not be transmitted to the projection optical system PL. Therefore, it is possible to prevent inconveniences in which the pattern image formed on the substrate P deteriorates due to the projection optical system PL vibrating. Also, since the liquid supply mechanism 10 (the liquid supplied member 12) and the liquid recovery mechanism 20 (the liquid recovery member 22) are separated, it is possible to prevent the occurrence of the inconvenience in which the liquid supply becomes unstable due to the liquid supply mechanism 10 vibrating due to vibration in the liquid recovery mechanism 20 (the liquid recovery member 22), and it is possible to perform exposure processing with good accuracy.

Note that, in the explanation of this embodiment, the liquid 1 is supplied from the supply pipe 11 onto the substrate P, which is the subject of exposure processing, but, for example, it is also possible to supply the liquid 1 onto various optical sensors such as an illuminance sensor provided on the substrate stage PST. In that case, that optical sensor will be able to execute various measurement processes at high accuracy via a liquid 1 supplied in the desired status.

Note that, in the embodiment discussed above, the configuration is such that the liquid on the substrate P is all collected after exposure of the substrate P is completed, but in the case where there is concern that the liquid will remain or adhere on the surface (rear surface) of the substrate P, a mechanism that blows off the liquid on top of the substrate P so as to remove it after the post-exposure substrate P has been conveyed from the substrate stage PST may also be provided. In that case, it is difficult to remove small drops, so removal of the liquid may be performed after exposing them to the liquid (for example, pure water) again.

In this embodiment, the control apparatus CONT of the exposure apparatus main body S, the temperature regulation control part 46 of the temperature regulation apparatus 40, and the pure water manufacturing control part 33 of the pure water manufacturing apparatus 30 are able to mutually communicate via the communication apparatus 400. Therefore, in performing liquid immersion exposure processing, for example, the pure water manufacturing control part 33 checks the fact that the operating status of the pure water manufacturing apparatus 30 is normal and outputs information that the operation of the pure water manufacturing apparatus 30 is normal, for example, a signal (ready signal) indicating that pure water manufacturing preparations are complete, to the control apparatus CONT via a communication apparatus 400 (401). In the same way, the temperature regulation control part 46 checks the fact that the operating status of the temperature regulation apparatus 40 is normal and outputs information (ready signal) that operation of the temperature regulation apparatus 40 is normal to the control apparatus CONT via a communication apparatus 400 (402). Then, the control apparatus CONT may start liquid immersion exposure processing after receiving "ready signals" respectively from the pure water manufacturing control part 33 and the temperature regulation control part 46.

In addition, for example, in the case where the pure water manufacturing control part 33 has confirmed that the operating status of the pure water manufacturing apparatus 30 is abnormal, it outputs information that operation of the pure water manufacturing apparatus 30 is abnormal, for example, a signal (emergency signal) indicating that an emergency situation has occurred, to the control apparatus CONT via the communication apparatus 400 (401). Similarly, in the case where the temperature regulation control part 46 has confirmed that the operating status of the temperature regulation apparatus 40 is abnormal, it outputs information (emergency signal) that operation of the temperature regulation apparatus 40 is abnormal to the control apparatus CONT via the communication apparatus 400 (402). In addition, the control apparatus CONT may not perform liquid immersion exposure processing in the case where an "emergency signal" has been received from either one of the pure water manufacturing control part 33 or the temperature regulation control part 46.

In addition, in the case where an "emergency signal" has been received during liquid immersion exposure, the control apparatus CONT may stop liquid immersion exposure processing.

In any case, even if the liquid 1 is regulated to the target temperature (for example, 23.0° C.) by the fine temperature regulator 45, there is a possibility that the temperature of the liquid 1 would change during flow through the supply pipe 11 or after supply onto the substrate P due to, for example, the emission, etc. of exposure light EL and that the liquid 1 on the substrate P would come to have a temperature (for example, 23.1° C.) that is different from the target temperature. Therefore, based on the length and material (the thermal conductivity) of the supply pipe 11 between the fine temperature regulator 45 and the liquid immersion region AR2, or the temperature conditions of the interior of the chamber apparatus CH and/or the exposure conditions (illumination of the exposure light EL, etc.), the liquid temperature at the time of the supply of the liquid 1 onto the substrate P after the temperature regulation by the fine temperature regulator 45 may be obtained by experiment and/or simulation in advance, and the target temperature of the liquid 1 at the fine temperature regulator 45 may be calibrated based on the obtained value, so as to control the temperature regulation.

In addition, in the embodiment discussed above, valves are provided on both the supply pipe 11 and the connection pipe 60, and when an abnormality has occurred in the recovery operation in the liquid recovery mechanism 20 (for example valve 26), it is possible to prevent water leakage damage at the substrate stage PST, or the like, by closing the flow path at both valve 16 of the supply pipe 11 and valve 66 of the connection pipe 60.

In addition, in the embodiment discussed above, the exposure apparatus EX has a pure water manufacturing apparatus 30, but it is not absolutely necessary for the exposure apparatus EX to have the pure water manufacturing apparatus 30, and the pure water manufacturing apparatus 30 may be substituted with equipment of the plant, etc. where the exposure apparatus EX is installed. In the same way, it is not necessary for the liquid recovery apparatus 25 of the exposure apparatus EX to be equipped with all of a vacuum pump, a gas-liquid separator, etc., and at least some of these may be replaced by equipment of the plant, etc. where the exposure apparatus EX is installed.

As described above, the liquid 1 in this embodiment is pure water. Pure water has advantages in that it can be easily obtained in large quantity at semiconductor fabrication plants, etc. and in that it has no adverse effects on the photoresist on the substrate P or on the optical elements (lenses), etc. In addition, pure water has no adverse effects on the environment and contains very few impurities, so one can also expect an action whereby the surface of the substrate P and the surface of the optical element provided on the front end surface of the projection optical system PL are cleaned. Note that, in the case where the purity of the pure water supplied from the plant, etc. is low, it may also be made such that the exposure apparatus has an ultra-pure water manufacturing apparatus.

In addition, the index of refraction n of pure water (water) with respect to exposure light EL with a wavelength of approximately 193 nm is nearly 1.44, so in the case where ArF excimer laser light (193 nm wavelength) is used as the light source of the exposure light EL, on the substrate P, it is possible to shorten the wavelength to 1/n, that is, approximately 134 nm, to obtain high resolution. Also, the depth of focus is expanded by approximately n times, that is, approximately 1.44 times compared with it being in air, so in the case where it would be permissible to ensure the same level of depth of focus as the case in which it is used in air, it is possible to further increase the numerical aperture of the projection optical system PL, and resolution improves on this point as well.

Note that, when the liquid immersion method is used in the aforementioned way, the numerical aperture NA of the projection optical system may also become 0.9-1.3. In this way, if the numerical aperture NA of the projection optical system is made larger, there are cases in which image formation performance deteriorates due to a polarization effect with the random polarized light conventionally used as the exposure light, so it is preferable that polarized illumination be used. In that case, it is desirable that linear polarization illumination adjusted to the longitudinal direction of the line pattern of the line and space pattern of the mask (reticle) is performed so that the diffracted light of the S polarization component (TE polarization component), that is, a polarization direction component along the longitudinal direction of the line pattern, is emitted from the mask (reticle) pattern in large quantities. In the case in which the space between the projection optical system PL and the resist deposited on the surface of the substrate P is filled with a liquid, the transmittivity of the diffracted light of the S polarization component (TE polarization component) at the resist surface, which contributes to the improvement of contrast, is higher than that of the case in which the space between the projection optical system PL and the resist deposited on the surface of the substrate P is filled with air (gas), so high image formation performance can be obtained even in such cases as when the numerical aperture NA of the projection optical system PL exceeds 1.0. In addition, it is even more effective when the phase shift mask, the oblique incidence illumination method (particularly, the dipole illumination method) adjusted to the longitudinal direction of the line pattern, such as that disclosed in Japanese Unexamined Patent Application Publication No. H6-188169, and the like, are appropriately combined.

In addition, for example, in the case where an ArF excimer laser is used as the exposure light, and a projection optical system PL with a reduction rate of approximately ¼ is used to expose the substrate P with a fine line and space pattern (for example, lines and spaces of approximately 25 to 50 nm), depending on the structure of the mask M (for example, the degree of fineness of the pattern and the thickness of the chrome), the mask M acts as a polarization plate due to the wave guide effect, and a large amount of the diffracted light of the S polarization component (TE polarization component) is emitted from the mask M as compared with the diffracted light of the P polarization component (TM polarization component), which reduces contrast, so it is preferable that the above linear polarization illumination be used, but even if the mask M were illuminated by random polarized light, it would be possible to obtain high resolution performance even in the case in which the numerical aperture NA of the projection optical system PL becomes large at 0.9 to 1.3. In addition, in a case in which the substrate P is exposed with an extremely fine line and space pattern on the mask M, there is a possibility that the P polarization component (TM polarization component) will be larger than the S polarization component (TE polarization component) due to the wire grid effect, but, for example, in the case in which an ArF excimer laser is used as the exposure light and a projection optical system PL with a reduction rate of approximately ¼ is used to expose the substrate P with a line and space pattern larger than 25 nm, a large amount of diffracted light of the S polarization component (TE polarization component) is emitted from the mask M as compared with diffracted light of the P polarization component (TM polarization component), so it would be possible to obtain high resolution performance even in the case in which the numerical aperture NA of the projection optical system PL becomes large at 0.9 to 1.3.

In addition, not only linear polarization illumination (S polarization illumination) adjusted to the longitudinal direction of the line pattern of the mask (reticle) but a combination of the polarization illumination method, in which the linear polarization is effected in the tangential (circumferential) direction of a circle whose center coincides with the optical axis, and an oblique incidence method is also effective, as disclosed in Japanese Unexamined Patent Application Publication No. H6-53120. In particular, when the pattern of the mask (reticle) includes not only a line pattern which extends in a prescribed one direction but also a line pattern that extends in a plurality of different directions in a mixed manner, by jointly using a polarization illumination method, in which the linear polarization is effected in the tangential direction of a circle whose center coincides with the optical axis, and an annular illumination method, also as disclosed in Japanese Unexamined Patent Application Publication No. H6-53120, it is possible to obtain high resolution performance even in the case in which the numerical aperture NA of the projection optical system is large.

In the present embodiment, the optical element 2 is attached to the front end of the projection optical system PL, and it is possible to use this lens to adjust the optical characteristics of the projection optical system PL, for example, aberration (spherical aberration, coma aberration, etc.). Note that, the optical element to be attached to the front end of the projection optical system PL may also be an optical plate used in adjustment of the optical characteristics of the projection optical system PL. Or, it may be a parallel flat surface plate that is able to transmit exposure light EL.

Note that, in the case where the pressure between substrate P and the optical element at the front end of the projection optical system PL generated by the flow of the liquid 1 is large, it may also be such that that optical element is not made replaceable but is securely fixed so that the optical element does not move due to that pressure.

Note that, in the present embodiment, the configuration is such that a liquid 1 is used to fill the space between the projection optical system PL and the surface of the substrate P, but it may also be, for example, a configuration in which the liquid 1 is provided in a status in which a cover glass consisting of a parallel flat plate is attached to the surface of the substrate P.

Note that, the liquid 1 of the present embodiment is water, but it may be a liquid other than water. For example, if the light source of the exposure light EL is an $F_2$ laser, this $F_2$ laser light will not pass through water, so the liquid 1 may be, for example, a fluorine group fluid, for example, a fluorocarbon oil or a perfluoropolyether (PFPE), which $F_2$ laser light is able to pass through. In this case, lyophilic treatment is performed on the portion that comes into contact with the liquid 1 by forming a thin film using a substance with a molecular structure with a low polarity, which includes fluorine for example. In addition, it is also possible to use a liquid 1 that is permeable by the exposure light EL and whose refractive index is as high as possible and that is stable with respect to the projection optical system PL and the photoresist disposed on the surface of the substrate P (for example, cedar oil). In this case as well, surface treatment is performed according to the polarity of the liquid 1 used.

Note that, applicable as the substrates P of the aforementioned respective embodiments are not only semiconductor wafers for the manufacture of semiconductor devices but glass plates for display devices, ceramic wafers for thin film magnetic heads, mask or reticle base plates (synthetic silica glass, silicon wafer) used in exposure apparatuses, or the like.

Applicable as the exposure apparatus EX are, in addition to step and scan system scanning exposure apparatuses (scanning steppers) that move the mask M and the substrate P in synchronization and scan-expose the substrate P with the pattern of a mask M, step and repeat system projection exposure apparatuses (steppers) that perform exposure using the whole pattern on the mask M in a status in which the mask M and the substrate P are made stationary, and sequentially step-move the substrate P. In addition, the present invention is also applicable to step and stitch system exposure apparatuses in which at least two patterns are partially overlaid and transferred onto the substrate P.

In addition, it can also be applied to a stitch system full field exposure apparatus that performs exposure of the substrate P with the reduced image of the whole first pattern by using a projection optical system (for example, a refracting type projection optical system, which does not include a reflection element, at, for example, a ⅛ reduction magnification) in a status in which the first pattern and the substrate P are made nearly stationary, and then performs exposure of the substrate P with the reduced image of the whole second pattern so that the second pattern is partially overlaid with the first pattern, by using that projection optical system in a status in which the second pattern and the substrate P are made nearly stationary.

In addition, the present invention can also be applied to twin stage type exposure apparatuses having a plurality of substrate stages. Twin stage exposure type apparatuses are disclosed in, for example, Japanese Unexamined Patent Application Publication No. H10-163099 and Japanese Unexamined Patent Application Publication No. H10-214783 (corresponding to U.S. Pat. Nos. 6,341,007, 6,400,441, 6,549,269 and 6,590,634), Published Japanese Translation No. 2000-505958 of the PCT International Publication (corresponding to U.S. Pat. No. 5,969,441) or U.S. Pat. No. 6,208,407, contents of which are incorporated herein by reference within a range of permission of the domestic laws and ordinances of the state designated or selected in this international application.

In addition, the present invention can also be applied to an exposure apparatus that has a measurement stage and a substrate stage disclosed in Japanese Unexamined Patent Application Publication No. H11-135400.

In addition, in the embodiment discussed above, an exposure apparatus that locally supplies liquid between the projection optical system PL and the substrate P is employed, but it is also possible to apply the present invention to a liquid immersion exposure apparatus in which the entire surface of the substrate subject to exposure is covered with the liquid. The structure and the exposure operation of a liquid immersion exposure apparatus in which the entire surface of the substrate subject to exposure is covered with the liquid is disclosed in detail in, for example, Japanese Unexamined Patent Application Publication No. H6-124873, Japanese Unexamined Patent Application Publication No. H10-303114 and U.S. Pat. No. 5,825,043, contents of which are incorporated herein by reference within a range of permission of the domestic laws and ordinances of the state designated or selected in this international application.

The type of exposure apparatus EX is not limited to exposure apparatuses that are used in the fabrication of semiconductor devices, in which a substrate P is exposed with a semiconductor element pattern, and it can also be widely applied to exposure apparatuses that are used in the manufacture of liquid crystal display elements and used in the manufacture of displays and exposure apparatuses for the manufacture of thin film magnetic heads, image pickup elements (CCDs), or reticles and masks.

In the case where a linear motor (see U.S. Pat. No. 5,623,853 or U.S. Pat. No. 5,528,118) is used in the substrate stage PST or the mask stage MST, an air floating type that uses air bearings or a magnetic levitation type that uses Lorentz's force or reactance force may be used. In addition, the respective stages PST, MST may be the types that move along a guide or may be the guideless type in which a guide is not provided.

For the driving mechanisms of the respective stages PST, MST, a planar motor that places in opposition a magnet unit that arranges magnets two-dimensionally and an armature unit that arranges coils two-dimensionally and drives the respective stages PST, MST by electromagnetic force may be used. In such a case, either the magnet unit or the armature unit is connected to the stage PST, MST, and the other from among the magnet unit and the armature unit may be provided on the moving surface side of the stage PST, MST.

The reaction force generated by the movement of the substrate stage PST may be caused to mechanically escape to the floor (ground) using a frame member so that it is not transmitted to the projection optical system PL, as described in Japanese Unexamined Patent Application Publication No. H8-166475 (U.S. Pat. No. 5,528,118).

The reaction force generated by the movement of the mask stage MST may be caused to mechanically escape to the floor (ground) using a frame member so that it is not transmitted to the projection optical system PL, as described in Japanese Unexamined Patent Application Publication No. H8-330224 (U.S. Pat. No. 5,874,820).

In the above way, the exposure apparatus EX of the present embodiment is manufactured by assembling various subsystems, including the respective constituent elements presented in the Claims of the present application, so that the prescribed mechanical precision, electrical precision and optical precision are maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems. The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly to the exposure apparatuses of the various subsystems has ended, overall adjustment is performed, and the various precisions are ensured for the exposure apparatus as a whole. Note that it is preferable that the manufacture of the exposure apparatus be performed in a clean room in which the temperature, the degree of cleanliness, etc. are controlled.

Figure 8:
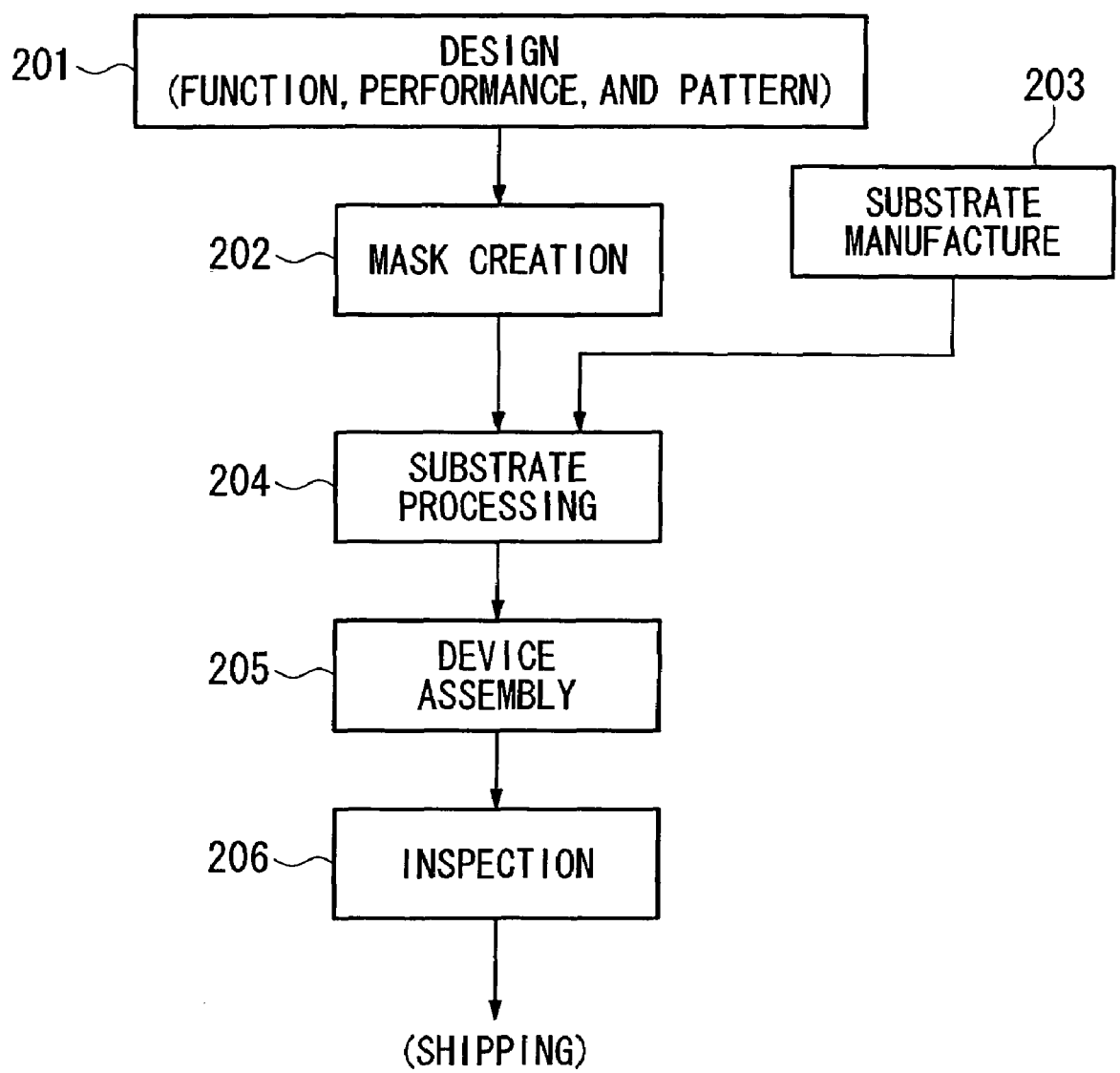
FIG. 8 is a flowchart diagram that shows an example of the semiconductor device manufacturing process.

As shown in FIG. 8, microdevices such as semiconductor devices are manufactured by going through a step 201 that performs microdevice function and performance design, a step 202 that creates the mask (reticle) based on this design step, a step 203 that manufactures the substrate that is the device base material, an exposure processing step 204 that exposes the substrate with the pattern of the mask by means of the exposure apparatus EX of the embodiment discussed above, a device assembly step (including the dicing process, bonding process and packaging process) 205, an inspection step 206, etc.

INDUSTRIAL APPLICABILITY

It is possible to form a pattern image on a substrate with high accuracy via a liquid that has been adjusted to a desired status and to perform measurement processing with high accuracy using various sensors, and it is possible to perform exposure processing with good accuracy.

The invention claimed is:

1. An exposure apparatus for emitting exposure light onto a substrate via a projection optical system and a liquid so as to expose the substrate, the apparatus comprising:
    a supply pipe which supplies the liquid;
    a recovery pipe which recovers the liquid;
    a connection pipe which connects the supply pipe and the recovery pipe; and
    a switching device which switches a flow path of the liquid in a manner such that when supply of the liquid from the supply pipe is stopped, the liquid that has flowed into the supply pipe flows to the recovery pipe via the connection pipe.

2. An exposure apparatus according to claim 1, wherein the switching device includes a valve provided on the connection pipe, and performs the switching of the flow path by opening or closing the valve.

3. An exposure apparatus according to claim 1, further comprising:
    a temperature regulation apparatus which is connected to the supply pipe and performs temperature regulation of the liquid supplied to the supply pipe, wherein
    the temperature regulation apparatus has a rough temperature regulator which roughly regulates the temperature of the liquid, and a fine temperature regulator which is arranged between the rough temperature regulator and the supply pipe and performs fine regulation of the temperature of the liquid.

4. An exposure apparatus according to claim 3, wherein the temperature regulation apparatus has a degassing apparatus which is arranged between the rough temperature regulator and the fine temperature regulator and reduces a gas dissolution concentration in the liquid.

5. An exposure apparatus according to claim 4, further comprising:
    a filter which is arranged between the rough temperature regulator and the fine temperature regulator and removes foreign matter in the liquid.

6. An exposure apparatus according to claim 3, further comprising:
    a chamber which accommodates the projection optical system and the supply pipe and whose interior is air-conditioned; and
    a temperature measuring apparatus which measures a temperature within the chamber,
    wherein temperature regulation of the liquid is performed by the temperature regulation apparatus based on a measurement result of the temperature measuring apparatus.

7. An exposure apparatus according to claim 6, wherein the temperature regulation apparatus is arranged outside the chamber.

8. An exposure apparatus described in claim 3, further comprising:
    a liquid temperature measuring apparatus which measures a temperature of one of the liquid inside the supply pipe and the liquid supplied from the supply pipe,
    wherein temperature regulation of the liquid is controlled by the temperature regulation apparatus based on a measurement result of the liquid temperature measuring apparatus.

9. A device manufacturing method comprising:
    exposing a substrate using the exposure apparatus according to claim 1; and
    processing the exposed substrate.

* * * * *